US012712560B2

(12) United States Patent
Tachibana

(10) Patent No.: US 12,712,560 B2
(45) Date of Patent: Aug. 18, 2026

(54) SEMICONDUCTOR INTEGRATED CIRCUIT, RECEPTION DEVICE, AND MEMORY SYSTEM

(71) Applicant: Kioxia Corporation, Tokyo (JP)

(72) Inventor: Fumihiko Tachibana, Yokohama (JP)

(73) Assignee: Kioxia Corporation, Tokyo (JP)

( * ) Notice: Subject to any disclaimer, the term of this patent is extended or adjusted under 35 U.S.C. 154(b) by 57 days.

(21) Appl. No.: 18/882,566

(22) Filed: Sep. 11, 2024

(65) Prior Publication Data

US 2025/0211245 A1 Jun. 26, 2025

(30) Foreign Application Priority Data

Dec. 20, 2023 (JP) ................................ 2023-215161

(51) Int. Cl.
*H03M 1/12* (2006.01)
*H03M 1/46* (2006.01)

(52) U.S. Cl.
CPC ............. *H03M 1/12* (2013.01); *H03M 1/125* (2013.01); *H03M 1/462* (2013.01); *H03M 1/466* (2013.01)

(58) Field of Classification Search
CPC ........ H03M 1/12; H03M 1/125; H03M 1/462; H03M 1/466
USPC .......................................... 341/118, 120, 155
See application file for complete search history.

(56) References Cited

U.S. PATENT DOCUMENTS 8,193,957 B2 * 6/2012 Yoshioka .............. H03M 1/462 341/120
9,584,144 B1 2/2017 Zhou et al.
11,133,812 B1 * 9/2021 Lebedev ................. H03M 1/40
11,811,419 B2 * 11/2023 Zabroda ................ H03M 1/466
2013/0002467 A1 1/2013 Wang

FOREIGN PATENT DOCUMENTS

JP 2014-519793 A 8/2014
JP 2016-213549 A 12/2016
JP 2019-516314 A 6/2019

* cited by examiner

*Primary Examiner* — Khai M Nguyen
(74) *Attorney, Agent, or Firm* — Oblon, McClelland, Maier & Neustadt, L.L.P.

(57) ABSTRACT

According to one embodiment, a semiconductor integrated circuit includes: a comparator configured to execute comparison processing of differential analog signals; and a control circuit configured to determine values of a plurality of bits based on a result of the comparison processing of the comparator and generate a digital signal including the determined values of the plurality of bits, wherein the control circuit is configured to set an initial value for a first bit of a determination target among the plurality of bits, and if the determination of the first bit is not ended in a first period, set a first temporary value having a first value for the first bit.

20 Claims, 20 Drawing Sheets

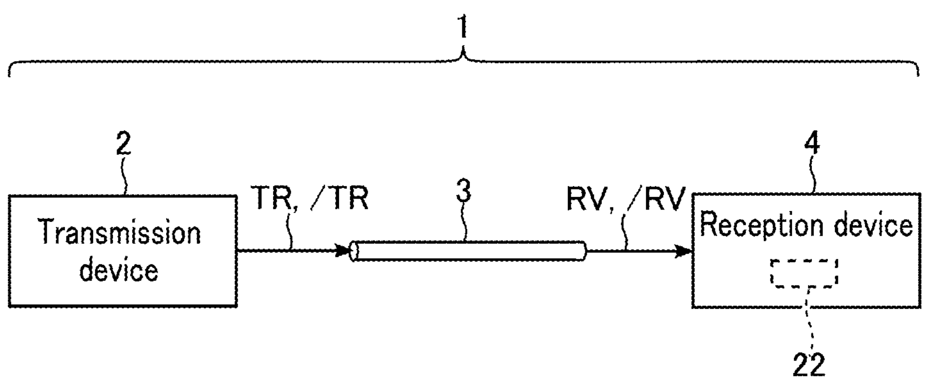
F I G. 1

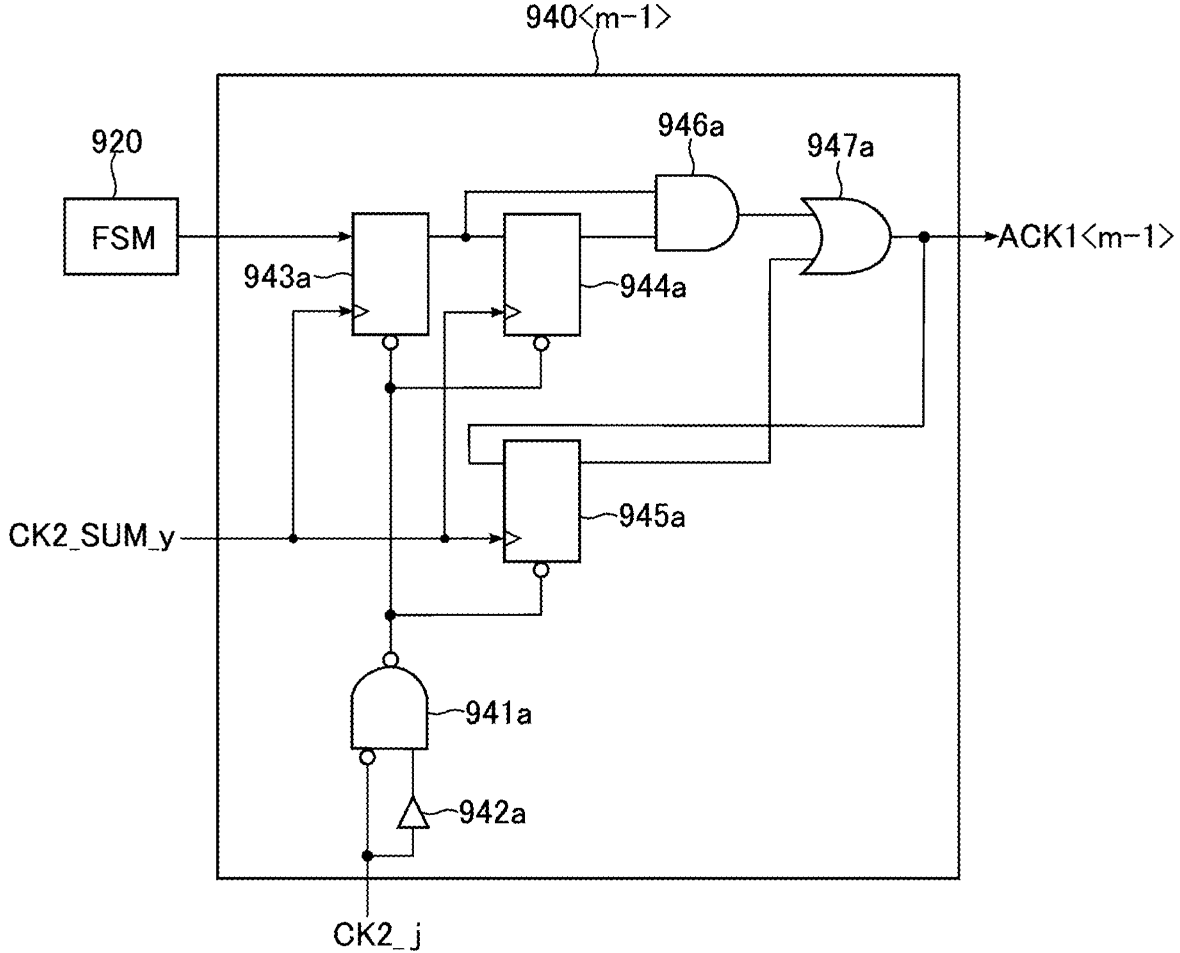
F I G. 6

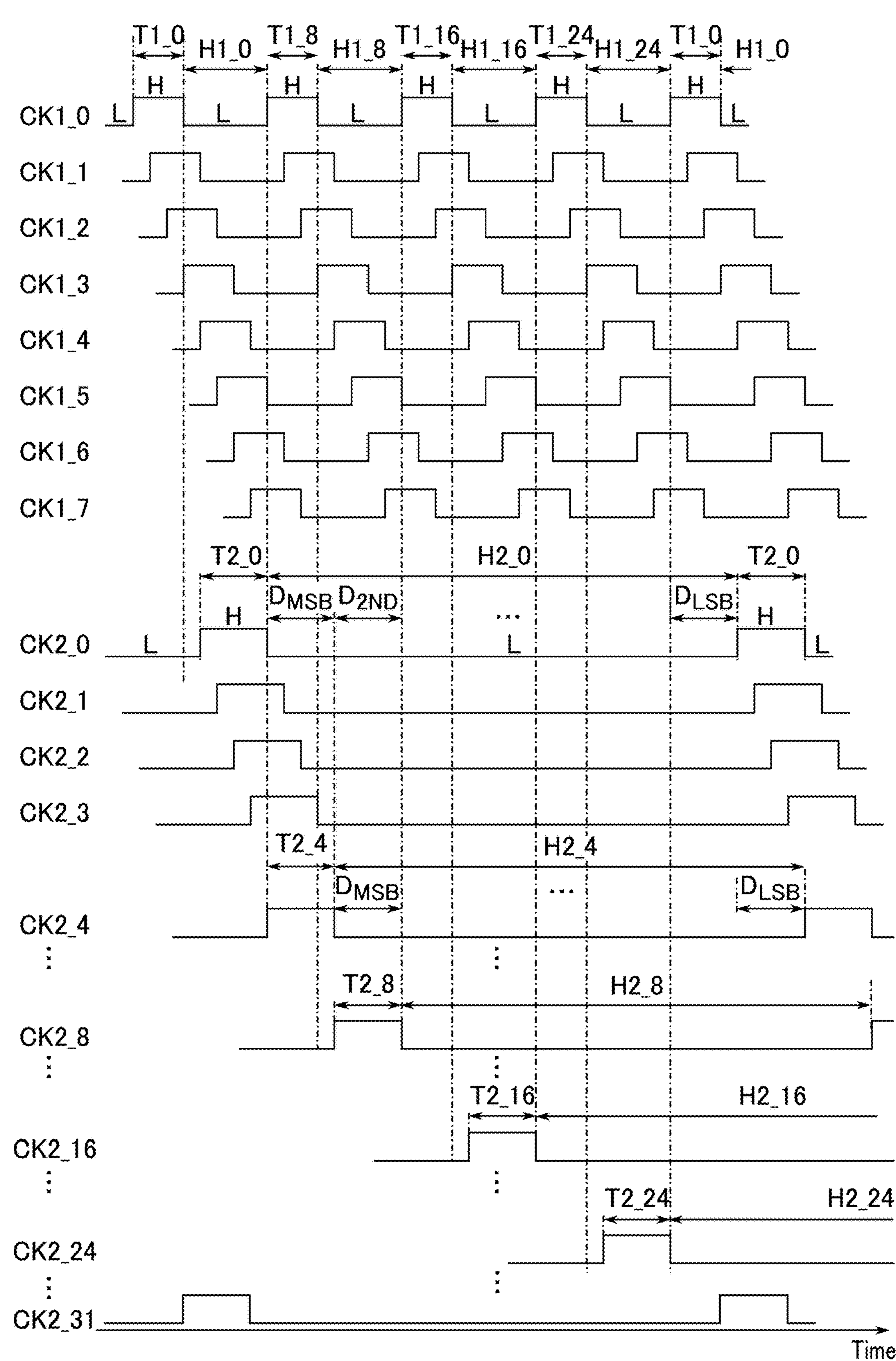
F I G. 8

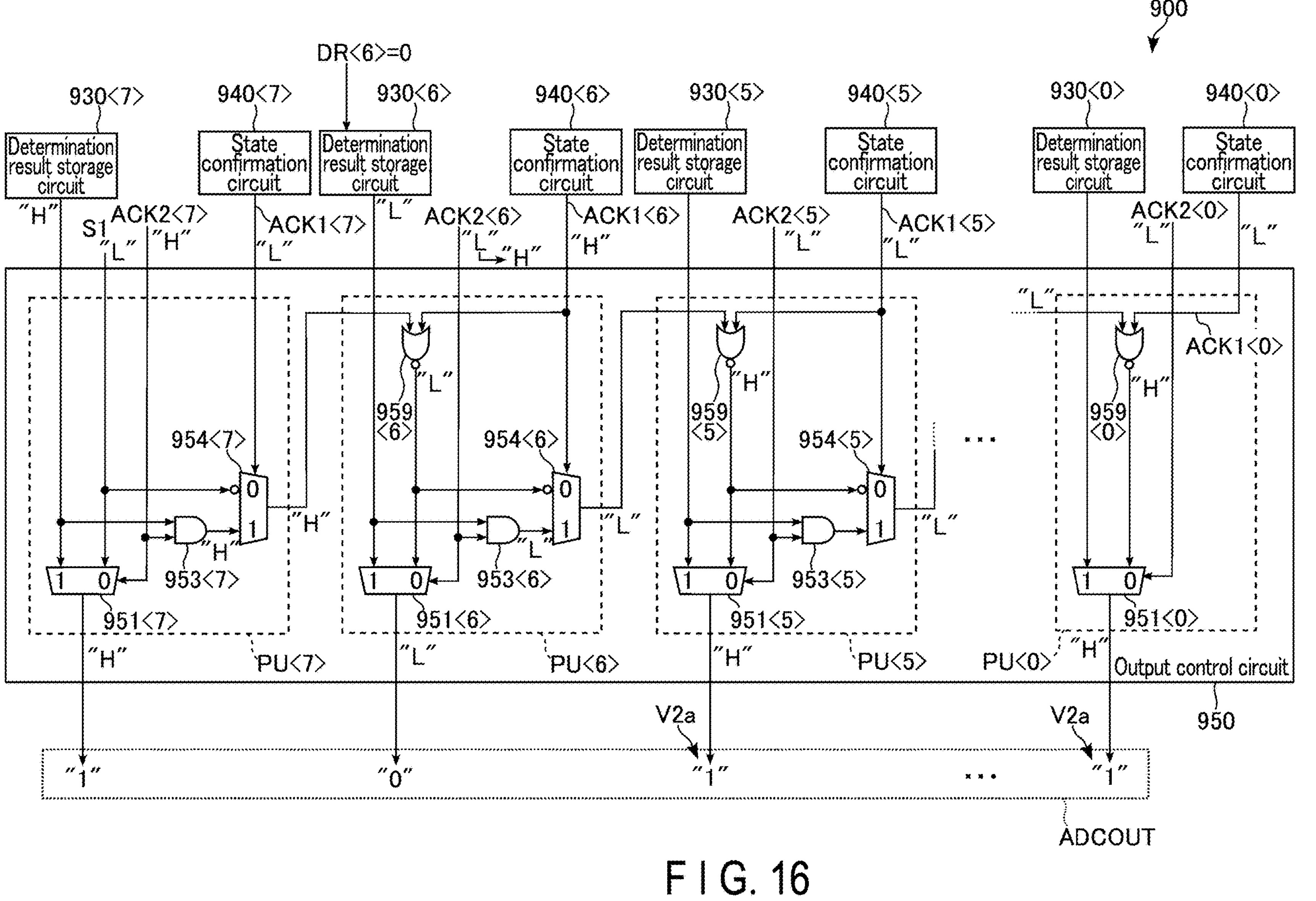
F I G. 16

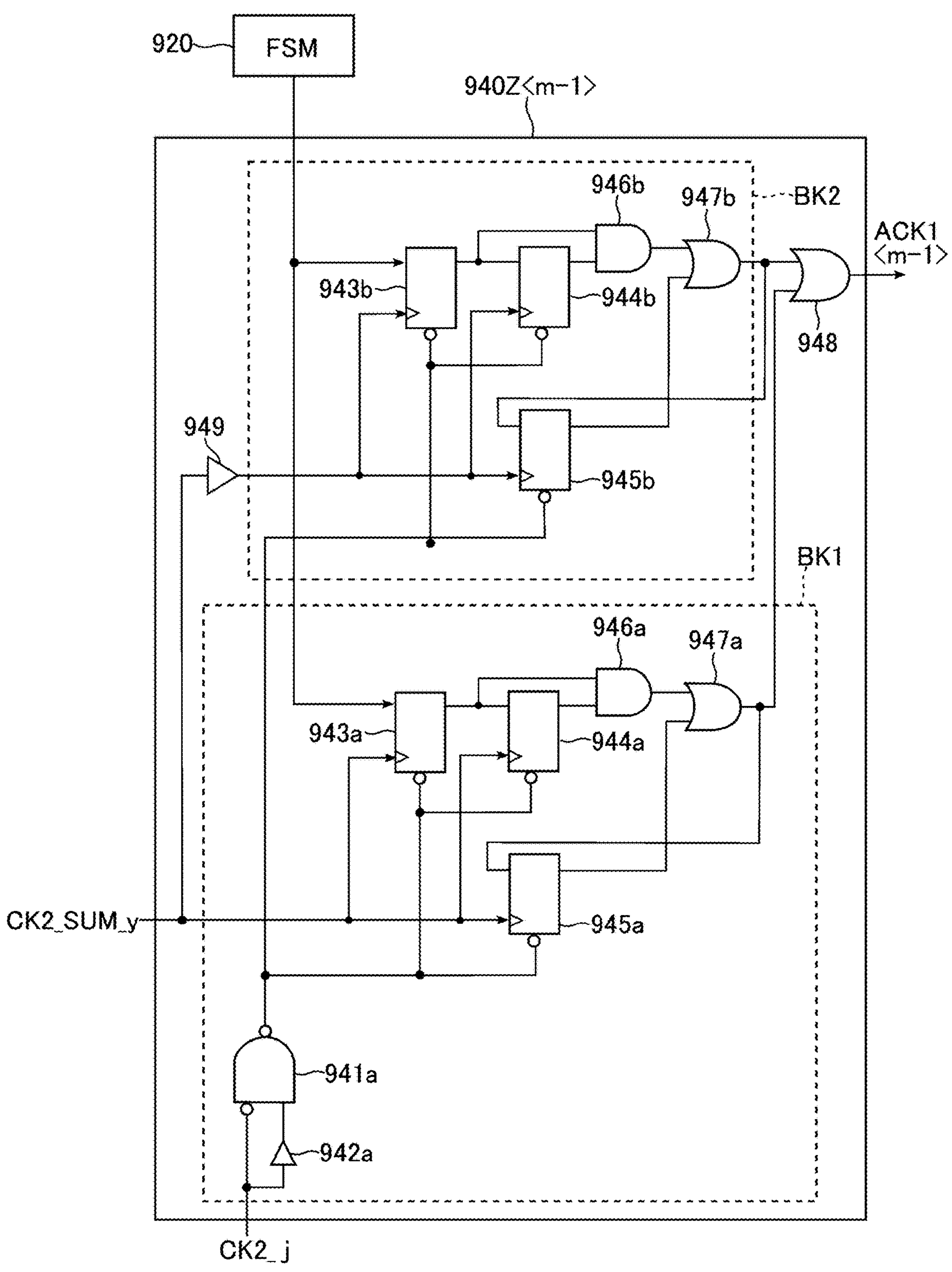
F I G. 18

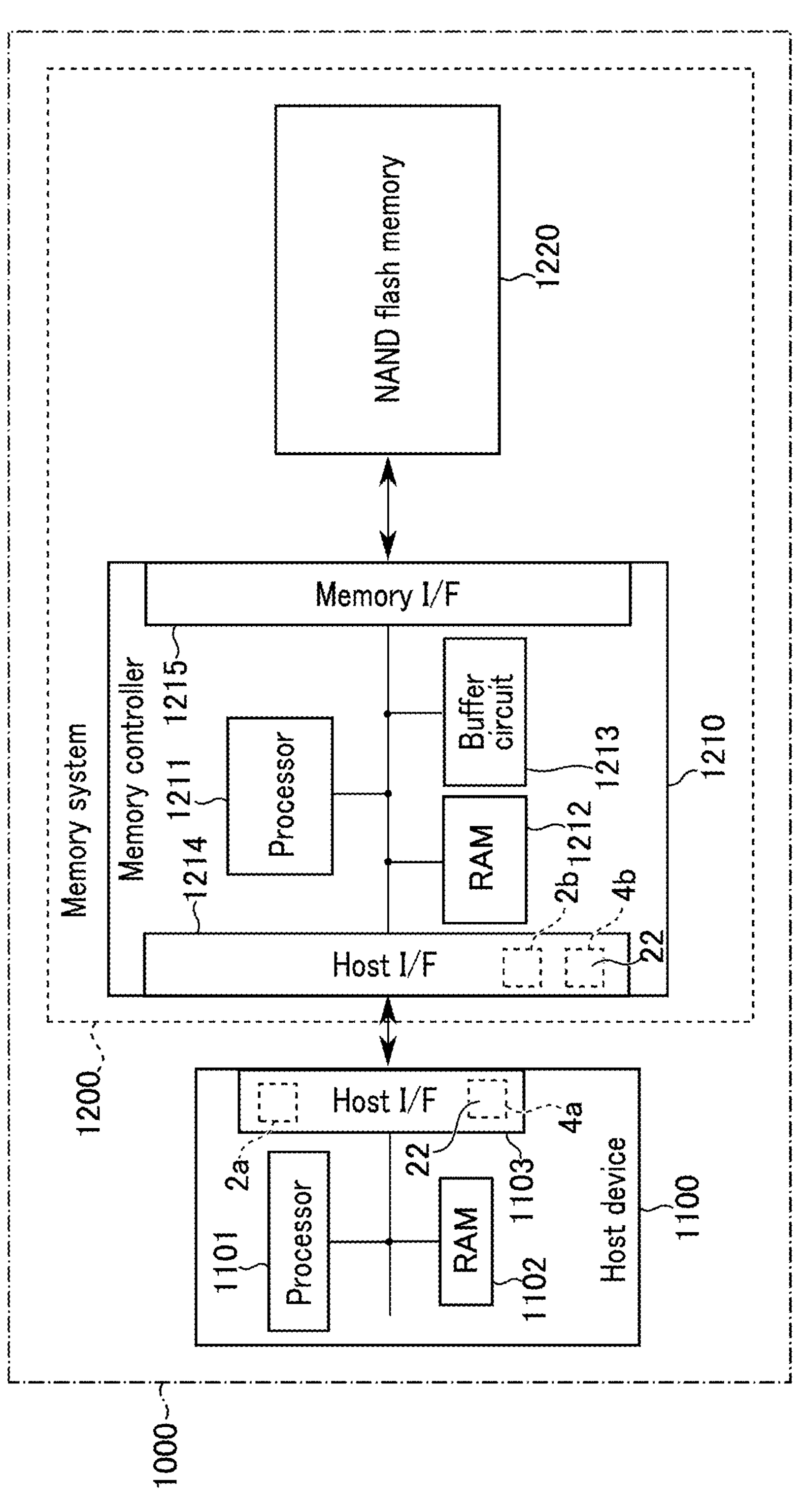
F I G. 20

SEMICONDUCTOR INTEGRATED CIRCUIT, RECEPTION DEVICE, AND MEMORY SYSTEM

CROSS-REFERENCE TO RELATED APPLICATIONS

This application is based upon and claims the benefit of priority from prior Japanese Patent Application No. 2023-215161, filed Dec. 20, 2023, the entire contents of which are incorporated herein by reference.

FIELD

Embodiments described herein relate generally to a semiconductor integrated circuit, a reception device, and a memory system.

BACKGROUND

A transmission device is connected to a reception circuit via a transmission path. The transmission device transmits an analog signal on which data is superimposed to the transmission path. A reception device receives the analog signal that has passed through the transmission path. The reception device includes a semiconductor integrated circuit configured to process the analog signal. The reception device generates a digital signal based on the analog signal. The reception device reproduces data based on the generated digital signal.

BRIEF DESCRIPTION OF THE DRAWINGS

FIG. 1 is a block diagram showing an example of a configuration of a system including a semiconductor integrated circuit and a reception device according to the embodiment.

FIG. 6 is a block diagram showing an example of an internal configuration of the determination processing circuit in the semiconductor integrated circuit according to the first embodiment.

FIG. 8 is a timing chart showing an example of a plurality of clock signals in the semiconductor integrated circuit according to the first embodiment.

FIG. 16 is a schematic view showing yet another state of the operation of the semiconductor integrated circuit according to the first embodiment.

FIG. 18 is a block diagram showing an example of a configuration of a semiconductor integrated circuit according to a second embodiment.

FIG. 20 is a block diagram showing an application example of the semiconductor integrated circuit and the reception device according to the embodiment.

DETAILED DESCRIPTION

Figure 2:
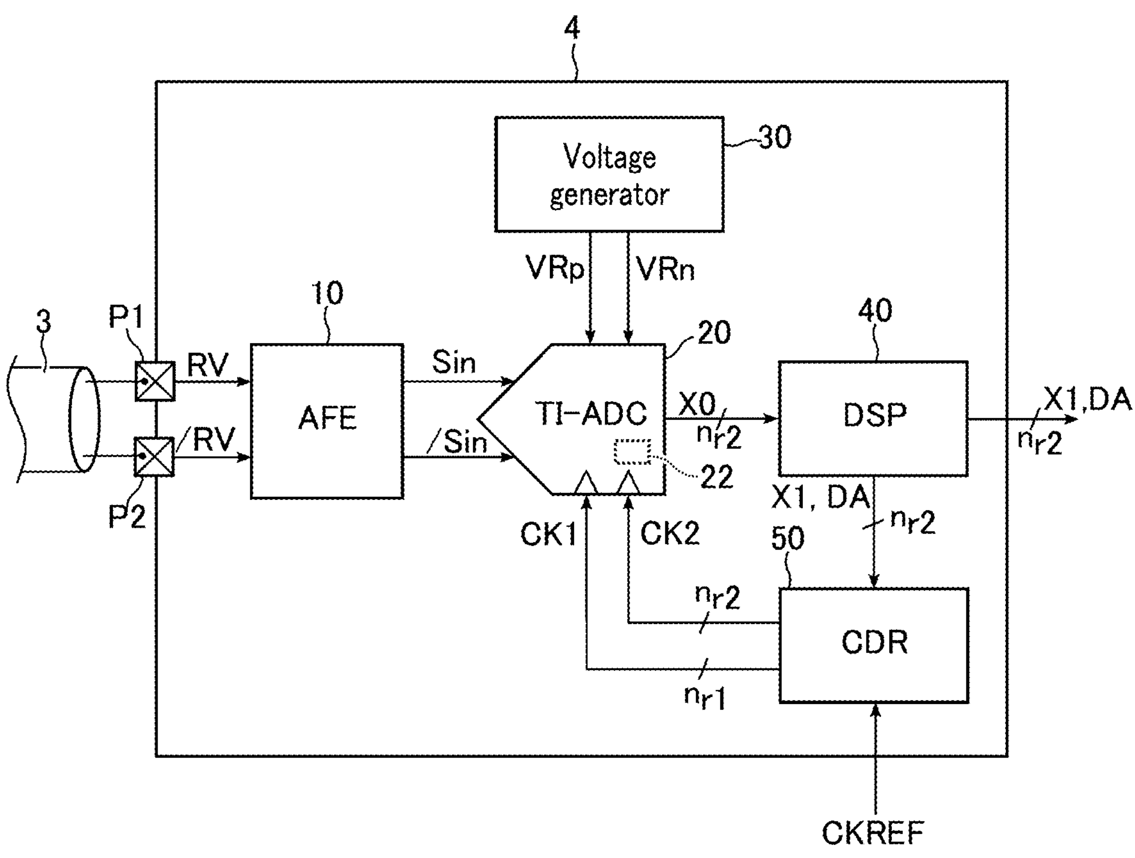
FIG. 2 is a block diagram showing an example of a configuration of the reception device according to the embodiment.

In general, according to one embodiment, a semiconductor integrated circuit includes: a comparator configured to execute comparison processing of differential analog signals; and a control circuit configured to determine values of a plurality of bits based on a result of the comparison processing of the comparator and generate a digital signal including the determined values of the plurality of bits, wherein the control circuit is configured to set an initial value for a first bit of a determination target among the plurality of bits, and if the determination of the first bit is not ended in a first period, set a first temporary value having a first value for the first bit.

A semiconductor integrated circuit and a reception device according to the embodiment will be described with reference to FIGS. 1, 2, 3, 4, 5, 6, 7, 8, 9, 10, 11, 12, 13, 14, 15, 16, 17, 18, 19, and 20. In the following explanation, the same reference numerals denote elements having the same functions and configurations. Also, in each of the following embodiments, if constituent elements (for example, circuits, interconnects, and various kinds of voltages and signals) denoted by reference numerals with numbers/characters for discrimination added at the end need not be discriminated from each other, expressions (reference numerals) without the numbers/characters at the end are used.

EMBODIMENTS

(1) First Embodiment

A semiconductor integrated circuit and a reception device according to a first embodiment will be described with reference to FIGS. 1, 2, 3, 4, 5, 6, 7, 8, 9, 10, 11, 12, 13, 14, 15, 16, and 17.

(a) Configuration Example (a-1) Communication System

A configuration of a communication system 1 including a semiconductor integrated circuit 22 according to some embodiments will be described with reference to FIG. 1. FIG. 1 is a block diagram showing an example of the configuration of the communication system 1 including the semiconductor integrated circuit 22 according to the embodiment.

The communication system 1 is configured to transmit data from one device to another device by high-speed serial communication. The communication system 1 includes a transmission device 2, a transmission path 3, and a reception device 4. The communication system 1 may be formed by a plurality of devices or a plurality of circuits provided on one printed wiring board, or may be formed by a plurality of devices or a plurality of circuits provided on different printed wiring boards.

The transmission device 2 is configured to transmit a signal TR and a signal/TR to the reception device 4 via the transmission path 3. The signal TR and the signal/TR are differential signals. The signal TR and the signal/TR are, for example, signals including a plurality of pulses. Data including a bit string is superimposed on each pulse of the signal TR and the signal/TR. The voltage level of each pulse of the signal TR and the signal/TR corresponds to the value of a bit of the data. The data superimposed on the pulse signal is transmitted from the transmission device 2 to the reception device 4 via the transmission path 3.

The transmission path 3 is a physical or spatial transmission medium configured to transmit the signal TR and the signal/TR to the reception device 4. The transmission path 3 is, for example, an interconnect that connects the transmission device 2 and the reception device 4. Note that the transmission path 3 may be a space capable of performing wireless communication. The transmission path 3 can have various transmission characteristics in accordance with the physical structure or material of the transmission medium. A transmission characteristics of the transmission path 3 include, for example, a frequency characteristic associated with a gain loss in a specific frequency band.

The signal TR and the signal/TR transmitted by the transmission device 2 suffer a loss according to the transmission characteristic of the transmission path 3 when the signal TR and the signal/TR pass the transmission path 3. This causes inter-symbol interference (ISI) in the signal TR and the signal/TR, which have passed through the transmission path 3. For this reason, the signal TR and the signal/TR, which have passed through the transmission path 3, are processed as analog signals. The signal TR and the signal/TR, which have passed through the transmission path 3, will be referred to as a signal RV and a signal/RV hereinafter. The signal RV and the signal/RV are analog signals.

The reception device 4 is configured to receive the signal RV and the signal/RV from the transmission path 3. Based on the signal RV and the signal/RV, the reception device 4 decodes the data superimposed on the signal TR and the signal/TR by the transmission device 2. The reception device 4 includes a reception circuit configured to decode the data superimposed on the signal TR and the signal/TR. The reception circuit is an aggregate of a plurality of semiconductor integrated circuits including the semiconductor integrated circuit 22 according to the embodiment.

(a-2) Reception Circuit

An example of a configuration of the reception device 4 according to this embodiment will be described with reference to FIG. 2. FIG. 2 is a block diagram showing an example of the configuration of the reception device 4 according to the embodiment.

As the reception circuit, the reception device 4 includes, for example, two pads P1 and P2, an analog frontend circuit 10, a time interleave-analog/digital converter circuit 20, a voltage generator 30, a digital signal processing circuit 40, and a clock data recovery circuit 50.

The pads P1 and P2 are terminals connected to the transmission path 3. The example of FIG. 2 shows a case where the pad P1 and the pad P2 receive the signal RV and the signal/RV, respectively, from the transmission device 2 via the transmission path 3.

The analog frontend circuit (AFE) 10 includes, for example, a continuous time linear equalizer (CTLE) and a variable gain amplifier (VGA). The CTLE is an amplification circuit that has a frequency characteristic for compensating for the frequency characteristic of the transmission path 3. The VGA is an amplification circuit capable of changing the gain. The AFE circuit 10 receives the signal RV and the signal/RV from the pad P1 and the pad P2, respectively. The AFE circuit 10 executes analog processing for the signal RV and the signal/RV using the CTLE and the VGA. The AFE circuit 10 generates a signal Sin and a signal/Sin based on the signal RV and the signal/RV. The signal Sin and the signal/Sin are analog signals, like the signal RV and the signal/RV. The AFE circuit 10 supplies the signal Sin and the signal/Sin to the time interleave-analog/digital converter circuit 20.

The time interleave-analog/digital converter (TI-ADC) circuit 20 executes processing of converting an analog signal into a digital signal by a time interleave method. The TI-ADC circuit 20 receives the signal Sin and the signal/Sin from the AFE circuit 10. The TI-ADC circuit 20 receives a reference voltage VRp and a reference voltage VRn from the voltage generator 30. The TI-ADC circuit 20 receives a signal CK1 and a signal CK2 from the clock data recovery circuit 50. The TI-ADC circuit 20 converts the signal Sin and the signal/Sin into a signal X0 based on the reference voltages VRp and VRn and the signals CK1 and CK2. The signal X0 is a digital signal. The TI-ADC circuit 20 sends the signal X0 to the digital signal processing circuit 40. The configuration of the TI-ADC circuit 20 will be described later.

The reference voltage VRp and the reference voltage VRn are voltages used in the processing of converting the analog signal into the digital signal in the TI-ADC circuit 20. The TI-ADC circuit 20 generates the signal X0 based on the magnitude relationship between the potential difference of the signal Sin and the signal/Sin and the potential difference (VRp−VRn) of the reference voltage VRp and the reference voltage VRn. The potential difference (VRp−VRn) of the reference voltage VRp and the reference voltage VRn will also be referred to as a reference voltage VREF hereinafter.

The signal CK1 is an aggregate of periodical signals including edges with periodicity. For example, the signal CK1 includes $n_{r1}$ clock signals. $n_{r1}$ is an integer of 1 or more (for example, 8). The $n_{r1}$ clock signals in the signal CK1 have a phase difference of, for example, at least 360°/$n_{r1}$. The $n_{r1}$ clock signals in the signal CK1 will be sometimes discriminately referred to as a signal CK1_0, . . . , and a signal CK1_($n_{r1}$−1) hereinafter. The frequency of the signal CK1 is lower than the frequency of a clock signal embedded in the signal TR and the signal/TR by the transmission device 2.

The signal CK2 is an aggregate of periodical signals including edges with periodicity. For example, the signal CK2 includes $n_{r2}$ clock signals. $n_{r2}$ is an integer larger than $n_{r1}$ (for example, 32). The $n_{r2}$ clock signals in the signal CK2 have a phase difference of, for example, at least 360°/$n_{r2}$. The $n_{r2}$ clock signals in the signal CK2 will be sometimes discriminately referred to as a signal CK2_0, . . . , and a signal CK2_($n_{r2}$−1) hereinafter. The frequency of the signal CK2 may be equal to the frequency of the clock signal embedded in the signal TR and the signal/TR by the transmission device 2. The frequency of the signal CK2 may be different from the frequency of the clock signal embedded in the signal TR and the signal/TR by the transmission device 2.

The signal X0 output from the TI-ADC circuit 20 includes a plurality of digital values. Each digital value includes a plurality of bits. One digital value included in the signal X0 is sampled from one symbol of the signal Sin and the signal/Sin based on one signal CK2_*j* (0≤j≤$n_{r2}$−1) in the signal CK2. One digital value is, for example, m-bit data. m is a natural number of 1 or more. For example, one digital value is 8-bit data. The values of the bits of the $n_{r2}$ digital values included in the signal X0 are sampled from $n_{r2}$ continuous symbols of the signal Sin and the signal/Sin based on the $n_{r2}$ signals CK2_0, . . . , a signal CK2_($n_{r2}$−1) in the signal CK2.

The $n_{r2}$ continuous digital values included in the signal X0 will be sometimes discriminately referred to as a digital value X0_0, . . . , and a digital value X0 ($n_{r2}$−1). The m-bit data included in a digital value X0_*j* will sometimes be referred to as a bit string X0_*j*<m−1:0>. j is 0 or more and $n_{r2}$-1 or less. Note that the bit string X0_*j*<m−1:0> means a string in which m bits from a most significant bit (MSB) X0_*j*<m−1> to a least significant bit (LSB)X0_*j*<0> are sequentially arranged in the data. The signal X0_*j* will sometimes be referred to as data or a bit string hereinafter.

The voltage generator (VREFGEN) 30 is configured to generate the reference voltage VRp and the reference voltage VRn. The voltage generator 30 supplies the generated reference voltages VRp and VRn to the TI-ADC circuit 20.

The digital signal processing (DSP) circuit 40 includes, for example, a feed forward equalizer (FFE), a decision feedback equalizer (DFE), and a data processing circuit. The signal X0 is supplied to the DSP circuit 40. The DSP circuit 40 executes digital processing for the signal X0 using the FFE, the DFE, and the data processing circuit. More specifically, the DSP circuit 40 generates a signal X1 and data DA based on the signal X0. The DSP circuit 40 outputs the signal X1 and the data DA to the clock data recovery circuit 50. The DSP circuit 40 outputs the signal X1 and the data DA to a subsequent circuit (not shown). The signal X1 and the data DA are processed by the subsequent circuit. The signal X1 and the data DA output to the clock data recovery circuit 50 may be the same as the signal X1 and the data DA output to the subsequent circuit or may be different from these.

The signal X1 is a digital signal, like the signal X0. The signal X1 of one cycle is an aggregate of nr2 digital values. The data DA is data decoded based on the signal X1.

The clock data recovery (CDR) circuit 50 receives the signal X1 and the data DA in each cycle. The CDR circuit 50 receives, for example, a reference clock signal CKREF from the transmission device 2. The reference clock signal CKREF may be generated in the CDR circuit 50 or in the reception device 4 independently of the transmission device 2. The CDR circuit 50 calculates the correction amount of the phases of the signal CK1 and the signal CK2 based on the reference clock signal CKREF, the signal X1, and the data DA. The CDR circuit 50 reproduces the signal CK1 and the signal CK2 based on the calculated correction amount of the phases. The CDR circuit 50 supplies the reproduced signals CK1 and CK2 to the TI-ADC circuit 20 in each cycle. In this way, the CDR circuit 50 reproduces the signals CK1 and CK2 serving as the reference of the sampling timing of the signal X0 of one subsequent cycle based on the signal X1 and the data DA generated from the signal X0 of one cycle. Such circulation processing in each cycle by the TI-ADC circuit 20, the DSP circuit 40, and the CDR circuit 50 is also called a CDR loop.

(a-3) Analog/Digital Converter

Figure 3:
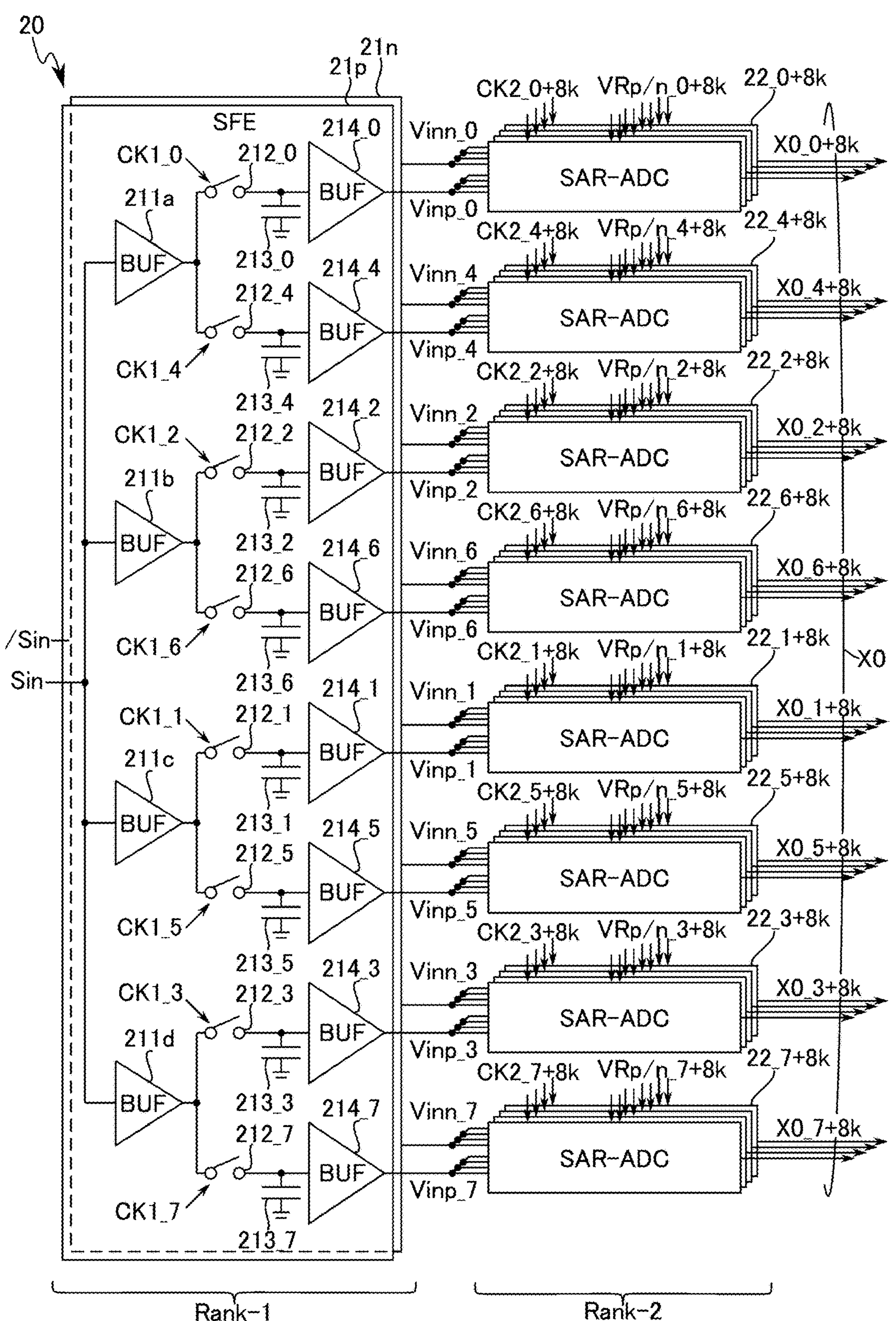
FIG. 3 is a block diagram showing an example of a configuration of an analog/digital converter circuit of the reception device according to the embodiment.

The internal configuration of the TI-ADC circuit 20 of the reception device 4 according to this embodiment will be described with reference to FIG. 3. FIG. 3 is a block diagram showing an example of the configuration of the TI-ADC circuit 20 of the reception device 4 according to the embodiment. Here, a case where (8, 32) is applied as a detailed combination of ($n_{r1}$, $n_{r2}$) will be described.

The TI-ADC circuit 20 includes two sampling frontends (SFE) 21*p* and 21*n*, and a plurality of successive approximation register analog/digital converters (SAR-ADCs) 22.

The plurality of SAR-ADCs 22 include 32 SAR-ADCs 22_0, . . . , and 22_31. In the example shown in FIG. 3, the four SAR-ADCs 22_0, 22_8, 22_16, and 22_24 are indicated by "SAR-ADC22_0+8k". k is 0 or more and 3 or less. Similarly, the four SAR-ADCs 22_1, 22_9, 22_17, and 22_25 are indicated by "SAR-ADC22_1+8k". The four SAR-ADCs 22_2, 22_10, 22_18, and 22_26 are indicated by "SAR-ADC22_2+8k". The four SAR-ADCs 22_3, 22_11, 22_19, and 22_27 are indicated by "SAR-ADC22_3+8k". The four SAR-ADCs 22_4, 22_12, 22_20, and 22_28 are indicated by "SAR-ADC22_4+8k". The four SAR-ADCs 22_5, 22_13, 22_21, and 22_29 are indicated by "SAR-ADC22_5+8k". The four SAR-ADCs 22_6, 22_14, 22_22, and 22_30 are indicated by "SAR-ADC22_6+8k". The four SAR-ADCs 22_7, 22_15, 22_23, and 22_31 are indicated by "SAR-ADC22_7+8k".

The SFE 21*p* receives the signal Sin from the AFE circuit 10. The SFE 21*p* generates a plurality of voltages Vinp based on the signal Sin. The SFE 21*p* outputs each of the plurality of generated voltages Vinp to a corresponding one of the plurality of SAR-ADCs 22. The plurality of voltages Vinp include eight voltages Vinp_0, Vinp_1, Vinp_2, Vinp_3, Vinp_4, Vinp_5, Vinp_6, and Vinp_7. The eight voltages Vinp_0, . . . , and Vinp_7 are preferably equal but may be different.

The SFE 21*n* receives the signal/Sin from the AFE circuit 10. The SFE 21*n* generates a plurality of voltages Vinn based on the signal/Sin. The SFE 21*n* outputs each of the plurality of generated voltages Vinn to a corresponding one of the plurality of SAR-ADCs 22. The plurality of voltages Vinn include eight voltages Vinn_0, Vinn 1, Vinn_2, Vinn_3, Vinn_4, Vinn_5, Vinn 6, and Vinn_7. The eight voltages Vinn_0, . . . , and Vinn_7 are preferably equal but may be different.

The SFE 21$p$ and the SFE 21$n$ substantially have the same configuration. The configuration of the SFE 21$p$ will mainly be described below.

The SFE 21$p$ includes a plurality of buffers 211, a plurality of switching elements 212, a plurality of capacitors 213, and a plurality of buffers 214. The plurality of buffers 211 include four buffers 211$a$, 211$b$, 211$c$, and 211$d$. The plurality of switching elements 212 include eight switching elements 212_0, 212_1, 212_2, 212_3, 212_4, 212_5, 212_6, and 212_7. The plurality of capacitors 213 include eight capacitors 213_0, 213_1, 213_2, 213_3, 213_4, 213_5, 213_6, and 213_7. The plurality of buffers 214 include eight buffers 214_0, 214_1, 214_2, 214_3, 214_4, 214_5, 214_6, and 214_7. Each of the plurality of switching elements 212 is configured to included, for example, a transistor. The signal CK1 is used as a control signal for on/off-controlling each switching element 212.

In the SFE 21$p$, the signal Sin is supplied to the input node of each of the buffers 211$a$, 211$b$, 211$c$, and 211$d$.

In the SFE 21$n$, the signal/Sin is supplied to the input node of each of the buffers 211$a$, 211$b$, 211$c$, and 211$d$.

The output node of the buffer 211$a$ is connected to the first node of each of the switching elements 212_0 and 212_4. The output node of the buffer 211$b$ is connected to the first node of each of the switching elements 212_2 and 212_6. The output node of the buffer 211$c$ is connected to the first node of each of the switching elements 212_1 and 212_5. The output node of the buffer 211$d$ is connected to the first node of each of the switching elements 212_3 and 212_7.

The second node of the switching element 212_0 is connected to the first node of the capacitor 213_0 and the input node of the buffer 214_0. The second node of the capacitor 213_0 is grounded. Grounding a node means connecting a node to the interconnect of a reference potential at the time of the operation of the SFE 21$p$. If the signal CK1_0 has "H" level, the switching element 212_0 is in an ON state. If the signal CK1_0 has "L" level, the switching element 212_0 is in an OFF state.

The second node of the switching element 212_1 is connected to the first node of the capacitor 213_1 and the input node of the buffer 214_1. The second node of the capacitor 213_1 is grounded. If the signal CK1_1 has "H" level, the switching element 212_1 is in the ON state. If the signal CK1_1 has "L" level, the switching element 212_1 is in the OFF state.

The second node of the switching element 212_2 is connected to the first node of the capacitor 213_2 and the input node of the buffer 214_2. The second node of the capacitor 213_2 is grounded. If the signal CK1_2 has "H" level, the switching element 212_2 is in the ON state. If the signal CK1_2 has "L" level, the switching element 212_2 is in the OFF state.

The second node of the switching element 212_3 is connected to the first node of the capacitor 213_3 and the input node of the buffer 214_3. The second node of the capacitor 213_3 is grounded. If the signal CK1_3 has "H" level, the switching element 212_3 is in the ON state. If the signal CK1_3 has "L" level, the switching element 212_3 is in the OFF state.

The second node of the switching element 212_4 is connected to the first node of the capacitor 213_4 and the input node of the buffer 214_4. The second node of the capacitor 213_4 is grounded. If the signal CK1_4 has "H" level, the switching element 212_4 is in the ON state. If the signal CK1_4 has "L" level, the switching element 212_4 is in the OFF state.

The second node of the switching element 212_5 is connected to the first node of the capacitor 213_5 and the input node of the buffer 214_5. The second node of the capacitor 213_5 is grounded. If the signal CK1_5 has "H" level, the switching element 212_5 is in the ON state. If the signal CK1_5 has "L" level, the switching element 212_5 is in the OFF state.

The second node of the switching element 212_6 is connected to the first node of the capacitor 213_6 and the input node of the buffer 214_6. The second node of the capacitor 213_6 is grounded. If the signal CK1_6 has "H" level, the switching element 212_6 is in the ON state. If the signal CK1_6 has "L" level, the switching element 212_6 is in the OFF state.

The second node of the switching element 212_7 is connected to the first node of the capacitor 213_7 and the input node of the buffer 214_7. The second node of the capacitor 213_7 is grounded. If the signal CK1_7 has "H" level, the switching element 212_7 is in the ON state. If the signal CK1_7 has "L" level, the switching element 212_7 is in the OFF state.

As described above, in the SFE 21$p$, the voltages Vinp_0, . . . , and Vinp_7 corresponding to the signal Sin at the timing when the signals CK1_0, . . . , and CK1_7 change to "H" level are sequentially held by the buffers 214_0, . . . , and 214_7, respectively. Similarly, in the SFE 21$n$, the voltages Vinn_0, . . . , and Vinn_7 corresponding to the signal/Sin at the timing when the signals CK1_0, . . . , and CK1_7 change to "H" level are sequentially held by the buffers 214_0, . . . , and 214_7, respectively.

The output node of the buffer 214_0 of each of the SFE 21$p$ and the SFE 21$n$ is connected to the SAR-ADCs 22_0, 22_8, 22_16, and 22_24. The output node of the buffer 214_1 of each of the SFE 21$p$ and the SFE 21$n$ is connected to the SAR-ADCs 22_1, 22_9, 22_17, and 22_25. The output node of the buffer 214_2 of each of the SFE 21$p$ and the SFE 21$n$ is connected to the SAR-ADCs 22_2, 22_10, 22_18, and 22_26. The output node of the buffer 214_3 of each of the SFE 21$p$ and the SFE 21$n$ is connected to the SAR-ADCs 22_3, 22_11, 22_19, and 22_27. The output node of the buffer 214_4 of each of the SFE 21$p$ and the SFE 21$n$ is connected to the SAR-ADCs 22_4, 22_12, 22_20, and 22_28. The output node of the buffer 214_5 of each of the SFE 21$p$ and the SFE 21$n$ is connected to the SAR-ADCs 22_5, 22_13, 22_21, and 22_29. The output node of the buffer 214_6 of each of the SFE 21$p$ and the SFE 21$n$ is connected to the SAR-ADCs 22_6, 22_14, 22_22, and 22_30. The output node of the buffer 214_7 of each of the SFE 21$p$ and the SFE 21$n$ is connected to the SAR-ADCs 22_7, 22_15, 22_23, and 22_31.

The SAR-ADC 22_0, . . . , and the SAR-ADC 22_31 receive the signals CK2_0, . . . , and CK2_31, respectively. The reference voltage VRp and the reference voltage VRn are supplied to each of the SAR-ADC 22_0, . . . , and the SAR-ADC 22_31 via different interconnects. The SAR-ADC 22_0, . . . , and the SAR-ADC 22_31 output signals X0_0, . . . , and X0_31, respectively, based on the corresponding signals CK2_0, . . . , and CK2_31 and the reference voltages VRp and VRn. The SAR-ADC 22_0, . . . , and the SAR-ADC 22_31 substantially have the same configuration. The signal CK2 is used as a control signal for controlling the operation of the SAR-ADC 22.

Note that the voltage levels of the reference voltages VRp and VRn can transiently vary in accordance with the operation states of the SAR-ADCs 22_0, . . . , and 22_31 of the supply sources.

For example, the constituent elements that operate in accordance with the signal CK1 belong to a layer Rank-1 in the TI-ADC circuit 20. For example, the constituent elements that operate in accordance with the signal CK2 belong to a layer Rank-2 in the TI-ADC circuit 20.

(a-4) Successive Approximation Register Analog/Digital Converter

Figure 4:
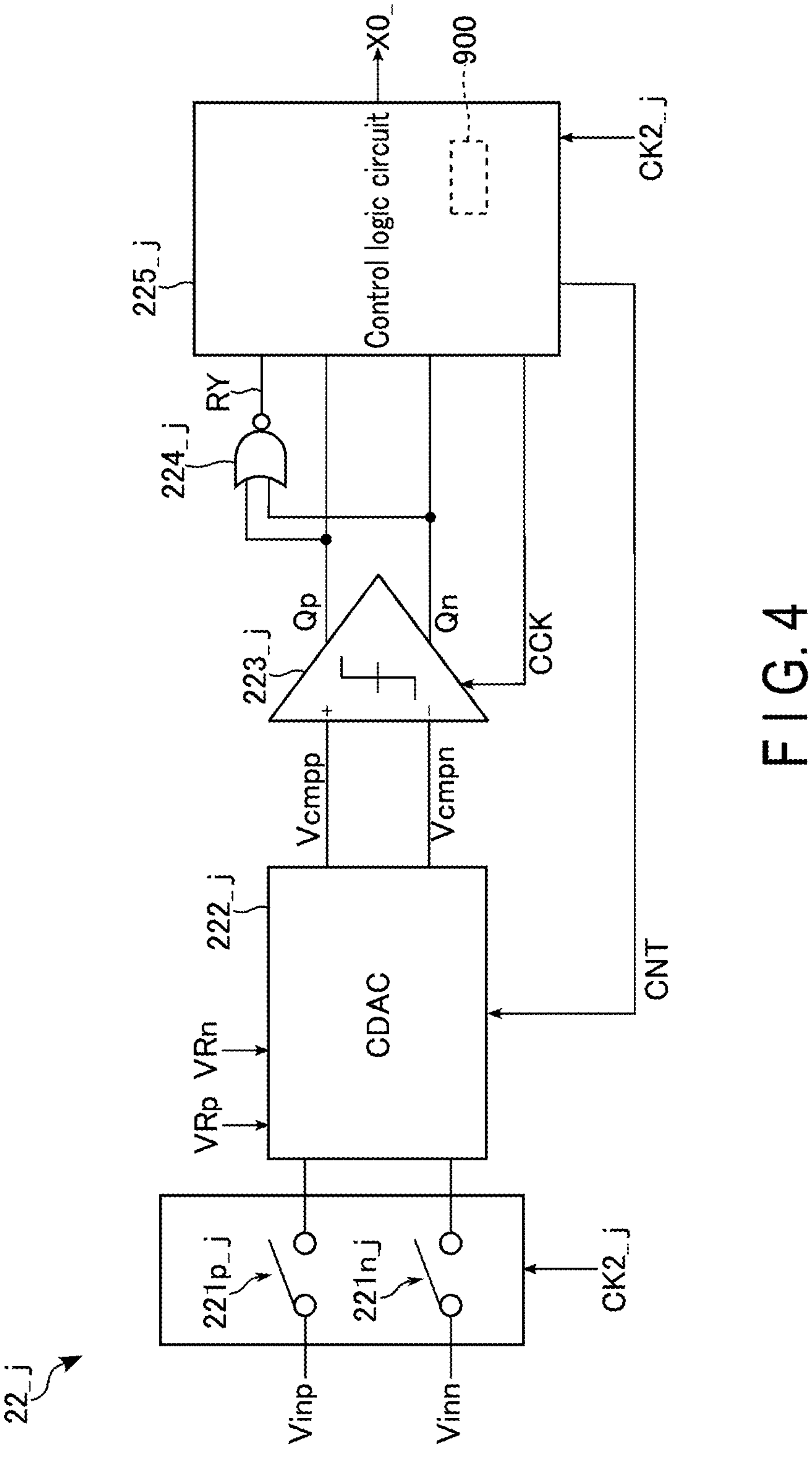
FIG. 4 is a block diagram showing an example of a configuration of a successive approximation register analog/digital converter in the semiconductor integrated circuit according to the first embodiment.

An internal configuration of the SAR-ADC 22 of the TI-ADC circuit 20 according to this embodiment will be described with reference to FIG. 4. FIG. 4 is a block diagram showing an example of the internal configuration of the SAR-ADC 22 of the TI-ADC circuit 20 according to the embodiment.

The example of FIG. 4 shows an example of the configuration of an arbitrary SAR-ADC 22_*j* among the 32 SAR-ADCs 22_0, . . . , and 22_31. j is 0 or more and ($n_{r2}$−1) (=31) or less.

The SAR-ADC 22_*j* executes a determination operation for a certain supplied bit string. The SAR-ADC 22_*j* is an SAR-ADC configured to determine, for example, up to 8 bits. The bit string determination operation by the SAR-ADC 22_*j* is called an SAR operation.

An asynchronous operation type SAR-ADC will be described below as an example of the SAR-ADC 22_*j*.

The SAR-ADC 22_*j* includes switching elements 221*p*_*j* and 221*n*_*j*, a capacitive digital/analog converter 222_*j*, a comparator 223_*j*, and a control logic circuit 225_*j*.

Each of the switching elements 221*p*_*j* and 221*n*_*j* includes a first node and a second node. The first node of the switching element 221*p*_j receives a voltage Vinp. The second node of the switching element 221*p*_*j* is connected to a first input node of a CDAC 222_*j*. The first node of the switching element 221*n*_j receives a voltage Vinn. The second node of the switching element 221*n*_*j* is connected to a second input node of the CDAC 222_*j*.

The switching elements 221*p*_j and 221*n*_j operate in accordance with a signal CK2_*j*. If the signal CK2_*j* has "H" level, the switching elements 221*p*_j and 221*n*_j are in the ON state. If the signal CK2_*j* has "L" level, the switching elements 221*p*_*j* and 221*n*_*j* are in the OFF state.

The capacitive digital/analog converter (CDAC) 222_*j* is formed by a plurality of capacitors and a plurality of switching elements. The plurality of capacitors and the plurality of switching elements form a switching capacitor array.

The CDAC 222_*j* includes the first input node, the second input node, a first output node, and a second output node. The first input node of the CDAC 222_*j* is connected to the second node of the switching element 221*p*_*j*. The second input node of the CDAC 222_*j* is connected to the second node of the switching element 221*n*_j.

The first output node of the CDAC 222_*j* is connected to a first input node of the comparator 223_*j*. The second output node of the CDAC 222_*j* is connected to a second input node of the comparator 223_*j*.

The CDAC 222_*j* holds the voltages Vinp and Vinn from the switching elements 221*p*_j and 221*n*_j in the plurality of capacitors. Charges corresponding to the voltage Vinp at the timing when the signal CK2_*j* changes to "H" level are charged in some of the plurality of capacitors of the CDAC 222_*j*. The voltage Vinp is thus held as the initial value of a voltage Vcmpp in the CDAC 222_*j*. Charges corresponding to the voltage Vinn at the timing when the signal CK2_*j* changes to "H" level are charged in some of the plurality of capacitors of the CDAC 222_*j*. The voltage Vinn is thus held as the initial value of a voltage Vcmpn in the CDAC 222_*j*.

The CDAC 222_*j* outputs the voltage Vcmpp in accordance with digital/analog conversion for the voltage Vinp from the switching element 221*p*_*j*. The CDAC 222_*j* outputs the voltage Vcmpn in accordance with digital/analog conversion for the voltage Vinn from the switching element 221*n*_*j*. For example, the CDAC 222_*j* executes digital/analog conversion using the reference voltages VRp and VRn from the voltage generator 30. The voltages Vcmpp and Vcmpn are analog signals.

The comparator 223_*j* includes the first input node and the second input node. The first input node of the comparator 223_*j* receives the voltage Vcmpp from the CDAC 222_*j*. The second input node of the comparator 223_*j* receives the voltage Vcmpn from the CDAC 222_*j*.

The comparator 223_*j* includes a first output node and a second output node. The first output node of the comparator 223_*j* is connected to a first input node of a NOR gate 224_*j* and the control logic circuit 225_*j*. The second output node of the comparator 223_*j* is connected to a second input node of the NOR gate 224_*j* and the control logic circuit 225_*j*.

The comparator 223_*j* receives a signal CCK from the control logic circuit 225_*j*. The comparator 223_*j* resets the first output node and the second output node of the comparator 223_*j* based on the signal CCK of "L" level. The comparator 223_*j* outputs signals Qp and Qn of "L" level from the reset first and second output nodes.

The comparator 223_*j* executes comparison processing of comparing the voltage Vcmpp and the voltage Vcmpn based on the signal CCK of "H" level. By the comparison processing of the comparator 223_*j*, determination of a plurality of bits included in the bit string X0_*j* is performed. In the comparison processing of the comparator 223_*j*, if the difference between the voltage Vcmpp and the voltage Vcmpn (to be referred to as a potential difference (Vcmpp−Vcmpn) hereinafter) is positive, the comparator 223_*j* outputs the signal Qp of "H" level from the first output node, and outputs the signal Qn of "L" level from the second output node. In the comparison processing of the comparator 223_*j*, if the potential difference (Vcmpp−Vcmpn) is negative, the comparator 223_*j* outputs the signal Qp of "L" level from the first output node, and outputs the signal Qn of "H" level from the second output node. If the potential difference (Vcmpp−Vcmpn) is considered to be 0, the comparator 223_*j* outputs the signal Qp of "L" level from the first output node, and outputs the signal Qn of "L" level from the second output node.

The NOR gate 224_*j* notifies the control logic circuit 225_*j* of the end of the comparison processing by the comparator 223_*j*. For example, if both the signal Qp and the signal Qn have "L" level, the NOR gate 224_*j* supplies a signal RY of "H" level to the control logic circuit 225_*j*. If the signal Qp or the signal Qn has "H" level, the NOR gate 224_*j* supplies the signal RY of "L" level to the control logic circuit 225_*j*. If the signal level of the signal RY output from the NOR gate 224_*j* transitions from "L" level to "H" level, the control logic circuit 225_*j* is notified that the comparison processing is ended or the comparison processing is in a metastable state. The metastable state indicates a state in which the value evaluated and determined by the comparison processing of the comparator 223_*j* is not determined.

The control logic circuit 225_*j* outputs the signal CCK of "L" level based on the signal CK2_*j* of "H" level. The control logic circuit 225_*j* outputs the signal CCK of "H" level based on the signal CK2_*j* of "L" level. The comparator 223_*j* executes comparison processing based on the signal CCK of "H" level. The control logic circuit 225_*j* executes determination processing of determining the certain bit string (data) X0_j sequentially from the most significant bit to the least significant bit based on the signal CK2_j of "L" level in accordance with the signal from the comparator 223_j. Based on the result of the determination processing, the control logic circuit 225_j outputs the bit string X0_j to a subsequent circuit such as the DSP circuit 40.

An example of determination processing for each bit in the bit string X0_j is performed as follows. If the signal level of the signal Qp is "H" level, and the signal level of the signal Qn is "L" level (if the potential difference (Vcmpp−Vcmpn) is positive), the control logic circuit 225_j determines that the corresponding bit is "1". If the signal level of the signal Qp is "L" level, and the signal level of the signal Qn is "H" level (if the potential difference (Vcmpp−Vcmpn) is negative), the control logic circuit 225_j determines that the corresponding bit is "0".

For example, if the signal level of the signal output from the NOR gate 224_j changes from "L" level to "H" level in a period in which the signal level of the signal CCK is "H" level, the control logic circuit 225_j detects that the determination processing (comparison processing) under execution is in the metastable state.

The control logic circuit 225_j generates a signal CNT. The control logic circuit 225_j supplies the generated signal CNT to the CDAC 222_j. Based on the signal CNT, the CDAC 222_j controls various kinds of operations associated with digital/analog conversion from the voltages Vinp and Vinn to the voltages Vcmpp and Vcmpn.

In this embodiment, the control logic circuit 225_j includes a determination processing circuit 900. The determination processing circuit 900 performs determination processing for the value of each bit included in the bit string based on the result of the comparison processing of the comparator 223_j. In the determination processing for each bit included in the bit string, if the signal levels of the signal Qp and the signal Qn (the voltage values of the voltages Vcmpp and Vcmpn) are not determined, and determination of a bit is not ended even if a certain period has elapsed, the determination processing circuit 900 sets a temporary value in the value of the bit under determination. If the determination of the bit for which the temporary value is set is ended after that, the determination processing circuit 900 sets a value corresponding to the determination result for the bit for which the temporary value is set. For example, if the comparison processing by the comparator 223_j is in the metastable state, the control logic circuit 225_j sets the temporary value in the value of the determination target bit in accordance with the occurrence of the metastable state.

(a-5) Determination Processing Circuit

Figure 5:
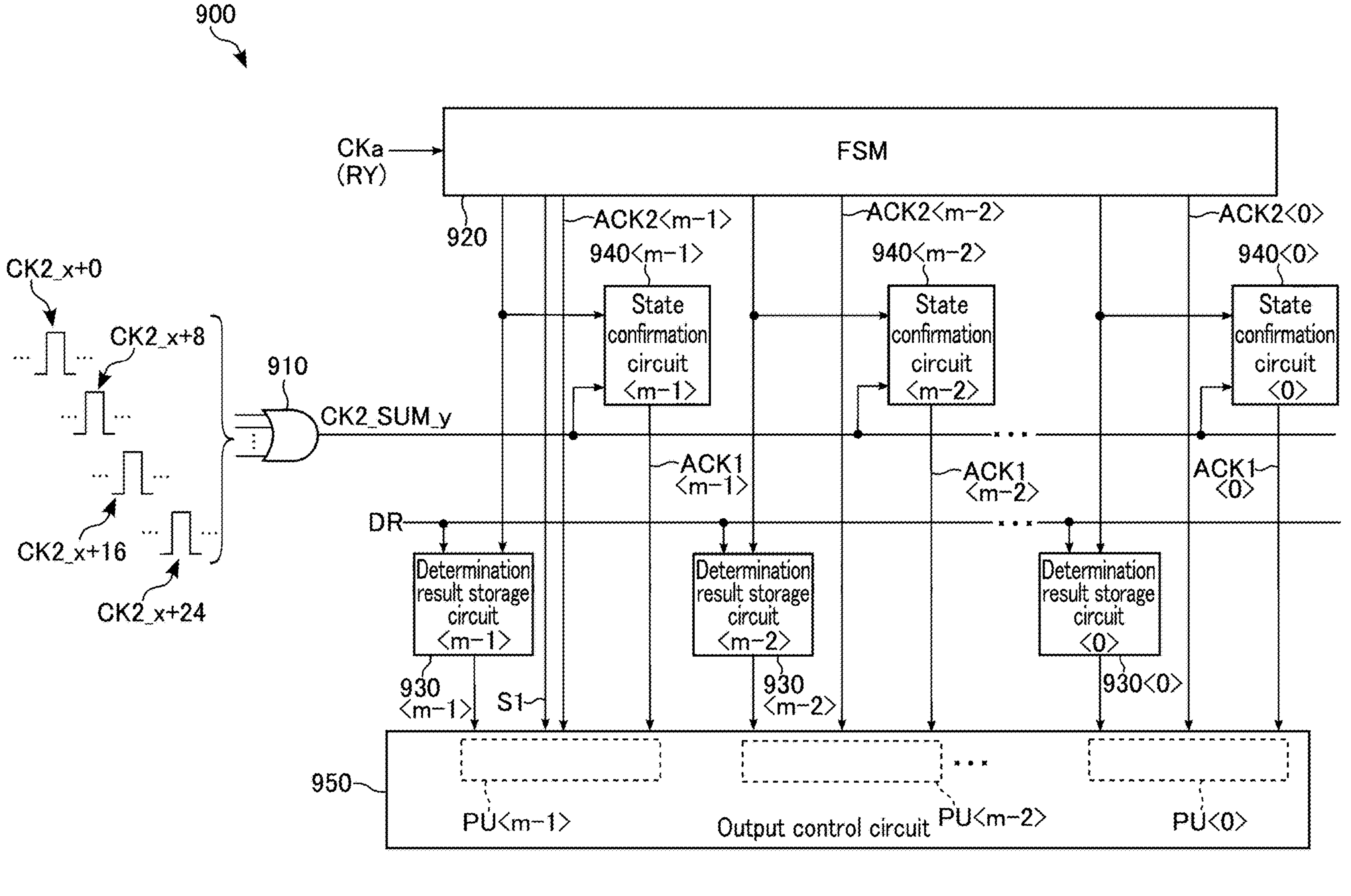
FIG. 5 is a block diagram showing an example of a configuration of a determination processing circuit in the semiconductor integrated circuit according to the first embodiment.

FIG. 5 is a block diagram for explaining an internal configuration of the determination processing circuit 900 in the semiconductor integrated circuit 22 according to this embodiment.

The determination processing circuit 900 includes a clock generator 910, a finite state machine 920, a plurality of determination result storage circuits 930, a plurality of state confirmation circuits 940, and an output control circuit 950.

The clock generator 910 generate a periodical signal including edges with periodicity. The clock generator 910 is formed by an OR gate. The clock generator 910 will be referred to as the OR gate 910 hereinafter. The OR gate 910 includes a plurality of input nodes and one output node. The OR gate 910 receives a plurality of signals CK2_x+8k. The OR gate 910 executes a logical disjunction operation (an OR operation) of the plurality of signals CK2_x+8k.

Each input node of the OR gate 910 receives one corresponding signal CK2 of the plurality of signals CK2_x+8k supplied to the OR gate 910. x is an integer of 0 or more and 7 or less. In the plurality of signals CK2_x+8k belonging to one set, a value k is changed within the range of 0 to 3 with respect to the certain fixed value x. The plurality of signals CK2_x+8k supplied to the OR gate 910 are the plurality of signals CK2 of Rank-2 associated with one of the plurality of signals CK1 of Rank-1. The plurality of signals CK2 of one set of Rank-2 are respectively supplied to the plurality of SAR-ADCs 22 forming a certain set. One of the plurality of signals CK2_x+8k equals the signal CK2_j. As a detailed example, if x is 0, and k is 0 to 3, the OR gate 910 receives the signal CK2_0, the signal CK2_8, the signal CK2_16, and the signal CK2_24. The OR gate 910 executes the OR operation of the signal CK2_0, the signal CK2_8, the signal CK2_16, and the signal CK2_24. A description will be made below using this example.

The output node of the OR gate 910 outputs a signal CK2_SUM_y. The signal CK2_SUM_y is a signal indicating the result of the OR operation of the signal CK2_0, the signal CK2_8, the signal CK2_16, and the signal CK2_24. The signal CK2_SUM_y is a clock signal (synthetic clock signal) generated by synthetizing the signal CK2_0, the signal CK2_8, the signal CK2_16, and the signal CK2_24. The signal CK2_SUM_y is supplied to the state confirmation circuits 940. y equals j. y is an integer of, for example, 0 or more and 31 or less. The signal CK2_SUM_y is a periodical signal including edges with periodicity.

Note that the signal CK2_SUM_y having a certain clock cycle may be generated by a clock oscillator (not shown) without being formed by synthesizing the plurality of signals CK2_x+8k.

The finite state machine (FSM) 920 controls operations of the plurality of determination result storage circuits 930, operations of the plurality of state confirmation circuits 940, and operation of the output control circuit 950. The FSM 920 receives a signal CKa. Based on the signal CKa, the FSM 920 manages which one of the plurality of bits included in the bit string X0_j is being determined. The signal CKa is an asynchronous signal. For example, the signal CKa is a signal according to the signal RY output from the NOR gate 224_j. The FSM 920 sends a signal S1 and signals ACK2 (ACK2<m−1>, ACK2<m−2>, . . . , and ACK2<0>) to the output control circuit 950. The FSM 920 sends a signal indicating the operation state of bit determination to each of the determination result storage circuits 930 and each of the state confirmation circuits 940.

Each of the plurality of (for example, m) determination result storage circuits 930 stores the value of corresponding one bit (to be also referred to as a bit value hereinafter) of the plurality of bits included in the bit string X0_j. Each determination result storage circuit 930 receives a signal DR corresponding to a value determined based on the comparison processing of the comparator 223_j. Under the control of the FSM 920, among the plurality of determination result storage circuits 930, the determination result storage circuit 930 corresponding to the bit under determination stores the signal DR based on the result of the comparison processing of the comparator 223_j as a bit value that has undergone the determination. For example, each of the determination result storage circuits 930 stores a value "0" as the initial value at the start of the SAR operation.

Each of the plurality of (for example, m) state confirmation circuits 940 confirms the operation state of determination of a corresponding bit of the plurality of bits in the bit string X0_j based on the signal from the FSM 920. This allows each state confirmation circuit 940 to recognize whether the corresponding bit is being evaluated. The state confirmation circuits 940 output metastable notification signals ACK1 (ACK1<m−1>, ACK1<m−2>, . . . , and ACK1<0>) based on the results of confirmation of the operation state of bit determination. The metastable notification signal ACK1 is a signal indicating that the operation state of bit determination is presumed to be the metastable state if the bit determination is not ended within a certain period.

For example, based on the number of detected rising edges of a plurality of clocks of the signal CK2_SUM_y, the state confirmation circuit 940 confirms whether bit determination under execution is in the metastable state. The state confirmation circuit 940 notifies a corresponding processing unit PU in the output control circuit 950 of a confirmation result indicating whether bit determination under execution is in the metastable state.

FIG. 6 is a block diagram showing an example of an internal configuration of the state confirmation circuit 940 according to this embodiment. FIG. 6 shows an example of the internal configuration of a state confirmation circuit 940<m−1>, and remaining state confirmation circuit 940<m−2>, . . . , and state confirmation circuit 940<0> also have the same internal configuration.

The state confirmation circuit 940<m−1> includes a NAND gate 941*a*, a delay element 942*a*, a plurality of flip-flops 943*a*, 944*a*, and 945*a*, an AND gate 946*a*, and an OR gate 947*a*.

The NAND gate 941*a* includes an input node of positive logic, an input node of negative logic, and an output node. The delay element 942*a* includes an input node and an output node.

The input node of positive logic of the NAND gate 941*a* is connected to the output node of the delay element 942*a*. The input node of the delay element 942*a* receives the signal CK2_*j*. The NAND gate 941*a* receives the signal CK2_*j* by the input node of positive logic via the delay element 942*a*. The NAND gate 941*a* receives the signal CK2_*j* by the input node of negative logic. The output node of the NAND gate 941*a* is connected to reset nodes of the flip-flops 943*a*, 944*a*, and 945*a*. The NAND gate 941*a* executes a logical non-conjunction operation (a NAND operation) of a signal of negative logic of the signal CK2_*j* and a delay signal of the signal CK2_*j*.

Each of the flip-flops 943*a*, 944*a*, and 945*a* includes the reset node and a clock node. The reset node of each of the flip-flops 943*a*, 944*a*, and 945*a* receives a signal from the NAND gate 941*a*. The reset node of each of the flip-flops 943*a*, 944*a*, and 945*a* is a node of negative logic. The flip-flops 943*a*, 944*a*, and 945*a* are set in a reset state by a signal of "L" level output from the NAND gate 941*a*. The clock node of each of the flip-flops 943*a*, 944*a*, and 945*a* receives the signal CK2_SUM_y from the output node of the OR gate 910. The flip-flops 943*a*, 944*a*, and 945*a* respectively latch signals supplied to input nodes of the flip-flops 943*a*, 944*a*, and 945*a* at a timing synchronized with the signal CK2_SUM_y.

Each of the flip-flops 943*a*, 944*a*, and 945*a* includes the input node and an output node. The AND gate 946*a* includes a first input node, a second input node, and an output node. The OR gate 947*a* includes a first input node, a second input node, and an output node.

The input node of the flip-flop 943*a* is connected to the FSM 920. The output node of the flip-flop 943*a* is connected to the input node of the flip-flop 944*a* and the first input node of the AND gate 946*a*. The output node of the flip-flop 944*a* is connected to the second input node of the AND gate 946*a*. The output node of the AND gate 946*a* is connected to the first input node of the OR gate 947*a*. The OR gate 947*a* receives a signal from the AND gate 946*a* by the first input node. The input node of the flip-flop 945*a* is connected to the output node of the OR gate 947*a*. The output node of the flip-flop 945*a* is connected to the second input node of the OR gate 947*a*.

The flip-flop 943*a* receives a signal from the FSM 920 by the input node. The flip-flop 944*a* receives a signal from the flip-flop 943*a* by the input node. The flip-flop 945*a* receives a signal from the OR gate 947*a* by the input node. The signal supplied from the FSM 920 to the flip-flop 943*a* is a signal indicating the operation state of determination of a corresponding bit. For example, the signal supplied from the FSM 920 to the flip-flop 943*a* is a signal based on the signal RY (and the signal CKa).

The AND gate 946*a* receives a signal from the flip-flop 943*a* by the first input node, and receives a signal from the flip-flop 944*a* by the second input node. The AND gate 946*a* executes logical conjunction operation (an AND operation) of the signal from the flip-flop 943*a* and the signal from the flip-flop 944*a*.

The OR gate 947*a* receives the signal from the AND gate 946*a* by the first input node, and receives a signal from the flip-flop 945*a* by the second input node. The OR gate 947*a* executes an OR operation of the signal from the AND gate 946*a* and the signal from the flip-flop 945*a*.

A signal output from the OR gate 947*a* is supplied as the metastable notification signal ACK1<m−1> to the output control circuit 950.

The state confirmation circuit 940<m−1> operates in the following way.

In the period of a certain SAR operation, each of the plurality of flip-flops 943*a*, 944*a*, and 945*a* operates at a timing synchronized with the signal CK2_SUM_y.

In the current cycle of the signal CK2_SUM_y, the flip-flop 943*a* stores the signal from the FSM 920. The flip-flop 944*a* stores the signal from the flip-flop 943*a*. The signal stored in the flip-flop 944*a* is a signal which has the same value as a signal from the FSM 920 in a cycle immediately before the current cycle of the signal CK2_SUM_y.

The AND gate 946*a* executes an AND operation of the signal from the flip-flop 943*a* and the signal from the flip-flop 944*a*. The AND gate 946*a* supplies a signal indicating the result of the AND operation to the OR gate 947*a*.

The flip-flop 945*a* stores a signal output from the OR gate 947*a* in a cycle immediately before the current cycle of the signal CK2_SUM_y. In the current cycle, the flip-flop 945*a* supplies a signal from the OR gate 947*a* in the immediately preceding cycle to the OR gate 947*a*.

The OR gate 947*a* executes an OR operation of the signal from the AND gate 946*a* and the signal from the flip-flop 945*a*. The OR gate 947*a* outputs a signal indicating the result of the OR operation as the metastable notification signal ACK1<m−1>. If both the signal from the AND gate 946*a* and the signal from the flip-flop 945*a* have a signal level of "L" level, the OR gate 947*a* outputs the metastable notification signal ACK1 of "L" level. If at least one of the signal from the AND gate 946*a* and the signal from the flip-flop 945*a* has a signal level of "H" level, the OR gate 947*a* outputs the metastable notification signal ACK1<m−1> of "H" level.

The NAND gate 941*a* receives the signal CK2_*j* by the input node of negative logic. The NAND gate 941*a* receives the delay signal of the signal CK2_*j* by the input node of positive logic via the delay element 942*a*. The NAND gate 941*a* executes a NAND operation of the signal of negative logic of the signal CK2_*j* and the delay signal of the signal CK2_*j*. The NAND gate 941*a* supplies a signal indicating the result of the NAND operation to the reset nodes of the flip-flops 943*a*, 944*a*, and 945*a*.

If the signal level of the signal from the NAND gate 941*a* is "L" level, the flip-flops 943*a*, 944*a*, and 945*a* are set in the reset state. The signal of "L" level from the NAND gate 941*a* is a signal indicating the end of the SAR operation.

In the period of the SAR operation, if each of the flip-flops 943*a*, 944*a*, and 945*a* stores a signal of "H" level, the OR gate 947*a* outputs the metastable notification signal ACK1 of "H" level.

For example, if the FSM 920 sets the signal level of a signal concerning the determination state of a certain determination target bit to "H" level during a period when two rising edges of the plurality of clocks of the signal CK2_SUM_y are supplied to the flip-flops 943*a*, 944*a*, and 945*a*, both the two flip-flops 943*a* and 944*a* latch the supplied signal of "H" level at a timing synchronized with the rising edge of the clock of the signal CK2_SUM_y. The OR gate 947*a* thus outputs the metastable notification signal ACK1<m−1> of "H" level.

With the above-described operation, the state confirmation circuit 940<m−1> outputs the metastable notification signal ACK1<m−1> in the current cycle based on the signal CK2_SUM_y. The output metastable notification signal ACK1<m−1> has a value indicating whether the operation state of bit determination is the metastable state in the cycle based on the signal CK2_SUM_y.

The determination target bit is recognized by the FSM 920. If the rising edge of the signal CK2_SUM_y is detected twice during the period of determining the determination target bit value, the signal holding state of the state confirmation circuit 940<m−1> is controlled such that the signal level of the metastable notification signal ACK1<m−1> to the processing unit PU<m−1> that is determining the corresponding bit value changes from "L" level to "H" level.

In this way, if determination of the determination target bit is not ended in the certain period, the state confirmation circuit 940 can confirm, based on the internal signal state, whether the operation state of determination of the corresponding bit is in a stagnant state (for example, the metastable state).

Referring back to FIG. 5, the output control circuit 950 outputs the data of a bit string obtained by the SAR operation based on the signals S1 and ACK2 from the FSM 920, signals from the determination result storage circuits 930, and the metastable notification signals ACK1 from the state confirmation circuits 940.

In this embodiment, if it is detected, based on the signals S1 and ACK2 from the FSM 920 and the metastable notification signal ACK1, that the determination of the bit value of the determination target is not ended in a certain period, the output control circuit 950 sets a temporary value in the bit value of the determination target. As a result, if the determination of the certain bit in the bit string stagnates, the output control circuit 950 can output the bit string including the temporary value.

The output control circuit 950 includes m processing units PU (PU<m−1>, PU<m−2>, . . . , and PU<0>). By processing of the plurality of processing units PU, the output control circuit 950 executes setting processing of bit values in the m-bit bit string X0_*j* during the period of the SAR operation. If the determination processing in the SAR operation is executed for an 8-bit bit string X0_*j*, the output control circuit 950 includes eight processing units PU. Each of the processing units PU is associated with one of the plurality of bits in the bit string X0_*j*. Each processing unit PU sets a temporary value or the value of the determination result in a corresponding bit.

Figure 7:
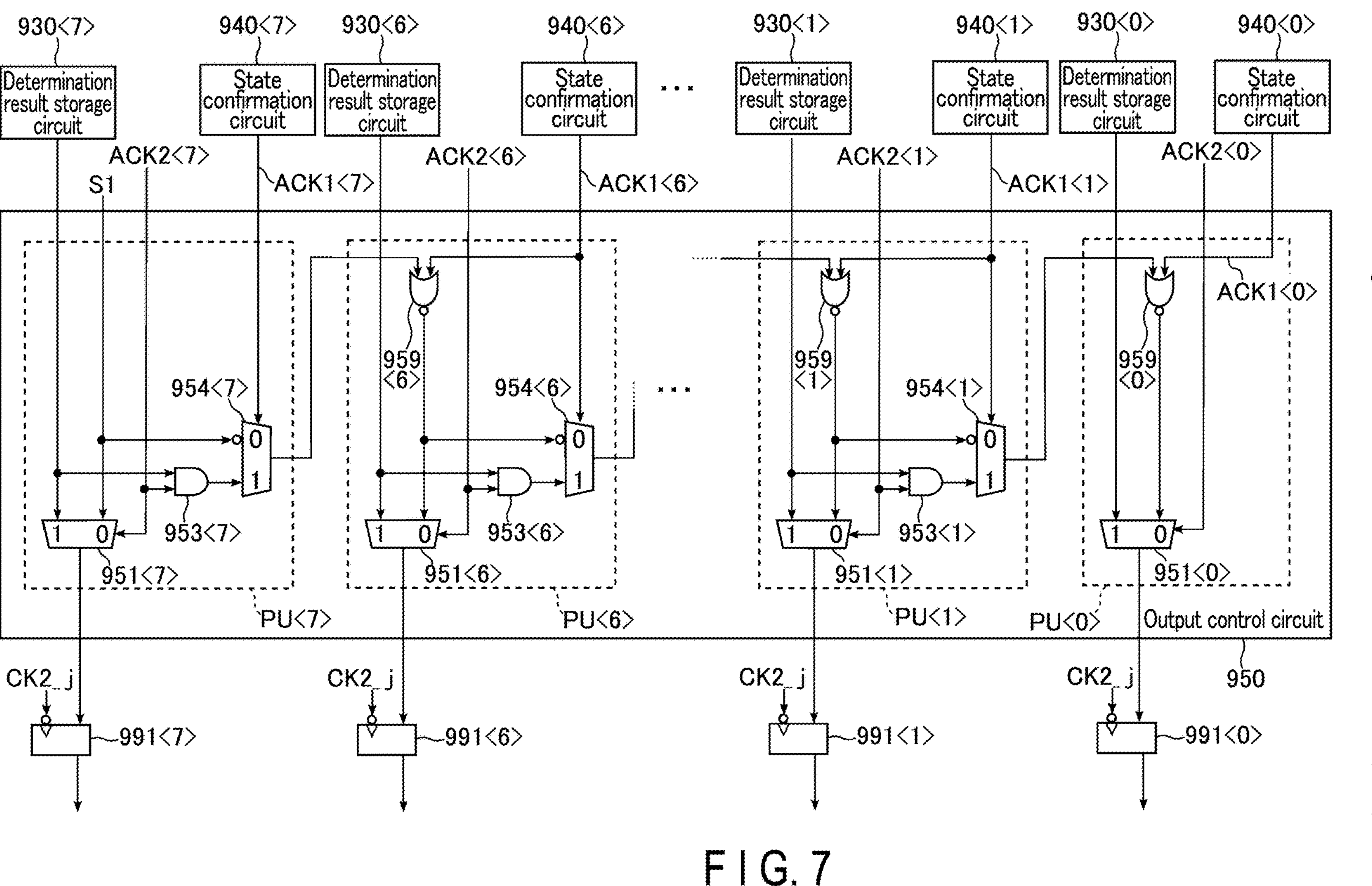
FIG. 7 is a block diagram showing another example of the internal configuration of the determination processing circuit in the semiconductor integrated circuit according to the first embodiment.

FIG. 7 is a block diagram showing an example of an internal configuration of the output control circuit 950. FIG. 7 also shows external constituent elements associated with the internal configuration of the output control circuit 950.

As shown in FIG. 7, the output control circuit 950 includes eight processing units PU (PU<7>, PU<6>, . . . , PU<1>, and PU<0>). The processing unit PU<7> corresponding to the most significant bit includes a selector 951<7>, an AND gate 953<7>, and a selector 954<7>. The processing units PU<6>, . . . , and PU<1> corresponding to the seventh to second bits include selectors 951 (951<6>, . . . , and, 951<1>), AND gates 953 (953<6>, . . . , and 953<1>), selectors 954 (954<6>, . . . , and 954<1>), and NOR gates 959 (959<6>, . . . , and 959<1>), respectively. The processing unit PU<0> corresponding to the least significant bit includes a selector 951<0> and a NOR gate 959<0>.

Each selector 951 includes a first input node, a second input node, an output node, and a control node. The first input node of the selector 951 is connected to the determination result storage circuit 930 of a corresponding bit of the plurality of bits included in the bit string X0_*j*. In the processing unit PU<7> corresponding to the most significant bit of the bit string X0_*j*, the second input node of the selector 951<7> is connected to, for example, the FSM 920. In the processing units PU<6>, . . . , and PU<0> corresponding to the bits other than the most significant bit, the second input nodes of the selectors 951<6>, . . . , and 951<0> are connected to the output nodes of the corresponding NOR gates 959, respectively. The output node of each selector 951 is connected to an input node of a corresponding flip-flop 991 of a plurality of flip-flops 991<7>, . . . , and 991<0>. The control node of the selector 951 is connected to the FSM 920. The control node of each selector 951 receives a corresponding one of the signals ACK2 (ACK2<7>, . . . , and ACK2<0>) from the FSM 920. The signal ACK2 is a signal indicating that the determination of the bit corresponding to the processing unit PU is ended. The signal ACK2 will be referred to as the determination end notification signal ACK2 hereinafter.

The input node of the flip-flop 991 receives a signal from the selector 951. The output node of the flip-flop 991 outputs a stored value. A reset node of the flip-flop 991 receives the signal CK2_*j*. The reset node of the flip-flop 991 is a node of negative logic. The flip-flop 991 latches the signal from the selector 951 at a timing according to the transition of the signal CK2_*j*. Each flip-flop 991 thus stores a signal from the corresponding processing unit PU.

Each AND gate 953 includes a first input node, a second input node, and an output node. The first input node of the AND gate 953 is connected to the FSM 920. The first input node of the AND gate 953 receives the corresponding determination end notification signal ACK2. The second input node of the AND gate 953 is connected to the corresponding determination result storage circuit 930. The second input node of the AND gate 953 receives a signal (value) stored in the determination result storage circuit 930. The output node of the AND gate 953 is connected to the first input node of the selector 954. The AND gate 953 executes an AND operation of the determination end notification signal ACK2 and the signal from the determination result storage circuit 930. The AND gate 953 sends a signal indicating the result of the AND operation to the selector 954.

The selector 954 includes a first input node, a second input node, an output node, and a control node. The first input node of the selector 954 is an input node of positive logic. The first input node of the selector 954 is connected to the output node of the AND gate 953. The second input node of the selector 954 is an input node of negative logic. In the processing unit PU<7> corresponding to the most significant bit, the second input node of the selector 954<7> is connected to the FSM 920. In the processing units PU<6>, . . . , and PU<1> corresponding to the bits other than the most significant bit, the second input node of the selector 954 is connected to the output node of the NOR gate 959 in the same processing unit PU. The output node of the selector 954 of the processing unit PU<m−1> is connected to a first input node of the NOR gate 959 of the processing unit PU<m−2> of the subsequent stage. The control node of the selector 954 is connected to the state confirmation circuit 940. The control node of the selector 954 receives the metastable notification signal ACK1.

The NOR gate 959 includes the first input node, a second input node, and the output node. The first input node of the NOR gate 959 is connected to the output node of the selector 954 of the processing unit PU of the preceding stage. The first input node of the NOR gate 959 receives a signal from the selector 954 of the processing unit PU of the preceding stage. The second input node of the NOR gate 959 is connected to the state confirmation circuit 940. The second input node of the NOR gate 959 receives the metastable notification signal ACK1. The output node of the NOR gate 959 is connected to the second input node of the selector 951 and the second input node of the selector 954 in the same processing unit PU. The NOR gate 959 of the processing unit PU<m−1> executes a NOR operation (a non-disjunction) of the supplied metastable notification signal ACK1 and the signal from the selector 954 of the processing unit PU<m> of the preceding stage. The NOR gate 959 sends a signal indicating the result of the NOR operation to the selector 951 and the selector 954.

Based on the metastable notification signal ACK1, the selector 954 in the certain processing unit PU<m−1> outputs one of the signal indicating the result of the AND operation from the AND gate 953 and an inverted signal of the signal supplied to the second input node to the NOR gate 959 of the processing unit PU<m−2> of the subsequent stage. If the operation state of the determination of the corresponding bit is the metastable state, the selector 954 selects the signal from the AND gate 953. If the state of the bit determination is not the metastable state, the selector 954 selects the inverted signal of the signal supplied to the second input node.

The selector 951 outputs one of the signal from the determination result storage circuit 930 and the signal input to the second input node of the selector 951 to the flip-flop 991 based on the determination end notification signal ACK2. If the determination of the corresponding bit is not ended, the selector 951 selects the signal supplied to the second input node. If the determination of the corresponding bit is ended, the selector 951 selects the signal from the determination result storage circuit 930. The value of the signal supplied to the second input node of the selector 951 corresponds to the temporary value that should be set in the determination target bit.

Hence, if the operation state of the determination of the corresponding bit is the metastable state, the determination processing circuit 900 can assign the temporary value to the bit whose bit determination is in the metastable state.

(b) Operation Example (b-1) Clock Timing

A clock timing in the reception device and the semiconductor integrated circuit according to this embodiment will be described with reference to FIG. 8. FIG. 8 is a timing chart showing an example of clock signals in the reception device according to the embodiment.

The signals CK1 are 8-phase clock signals whose phases are shifted at equal intervals. The period of "H" level of each signal CK1 is T1. In the signal CK1, the periods of "H" level are substantially equal. The period of "L" level of each signal CK1 is H1. In the signal CK1, the periods of "L" level are substantially equal.

The signals CK2 are 32-phase clock signals whose phases are shifted at equal intervals. The period of "H" level of each signal CK2 is T2. In the signal CK2, the periods of "H" level are substantially equal. The period of "L" level of each signal CK2 is H2. In the signal CK2, the periods of "L" level are substantially equal.

The $n_{r2}/n_{r1}$ cycle of the signal CK1 equals, for example, one cycle of the signal CK2. If $n_{r1}=8$, and $n_{r2}=32$, 4(T1+H1)=T2+H2. The period H1 is, for example, longer than the period H2.

The relationship between the signal CK1_0 and the signal CK2 will be described below.

In a period (a period T1_0 in FIG. 8) when the signal level of the signal CK1_0 in the first cycle is "H" level, the switching elements 212_0 of the SFE 21*p* and the SFE 21*n* shown in FIG. 3 are turned on. Charges corresponding to the signal Sin and the signal/Sin are thus charged in the capacitors 213_0 of the SFE 21*p* and the SFE 21*n*, respectively. In a period (a period H1_0 in FIG. 8) when the signal level of the signal CK1_0 in the first cycle is "L" level, the switching elements 212_0 of the SFE 21*p* and the SFE 21*n* are turned off. In the period H1_0, the buffer 214_0 holds the charges charged in the capacitor 213_0, respectively.

The period H1_0 includes a period (a period T2_0 in FIG. 8) when the signal CK2_0 has "H" level. In the period T2_0, the switching elements 221*p*_0 and 221*n*_0 of the SAR-ADC 22_0 are turned on. The charges held by the buffer 214_0 of each of the SFE 21*p* and the SFE 21*n* are thus charged in the plurality of capacitors of the CDAC 222_0.

After that, in a period (a period H2_0 in FIG. 8) when the signal CK2_0 has "L" level, the switching elements 221*p*_0 and 221*n*_0 of the SAR-ADC 22_0 are turned off. In the period H2_0, the CDAC 222_0 holds the charges charged in the plurality of capacitors of the CDAC 222_0. The held charges are stored over the period H2_0. Using the held charges, the bit string X0_0<7:0> included in the data X0_0 is sequentially determined from the most significant bit to the least significant bit.

In FIG. 8, a period when the most significant bit (first bit) is determined, a period when the second bit is determined, . . . , and a period when the least significant bit is determined are indicated by periods $D_{MSB}$, $D_{2ND}$, . . . , and $D_{LSB}$, respectively. In the example shown in FIG. 8, the period $D_{MSB}$ of the signal CK2_0 is included in a period (a period T2_4 in FIG. 8) when the signal CK2_4 has "H" level. The period $D_{2ND}$ of the signal CK2_0 is included in a period (a period T2_8 in FIG. 8) when the signal CK2_8 has "H" level. The period $D_{MSB}$ of the signal CK2_4 is included in a period (a period T2_8 in FIG. 8) when the signal CK2_8 has "H" level. Note that each of the periods $D_{MSB}$, $D_{2ND}$, . . . , and $D_{LSB}$ may be located across periods when a plurality of clock signals of the signal CK2 have "H" level.

For example, the rising edge of the signal CK2_8 is shifted from the falling edge of the signal CK2_0 by the period $D_{MSB}$.

In the signal CK1_0, the operations in the second, third, and fourth cycles are substantially the same as in the first cycle. That is, in periods (periods T1_8, T1_16, and T1_24 in FIG. 8) when the signal level of the signal CK1_0 in the second, third, and fourth cycles is "H" level, the switching elements 212_0 of the SFE 21*p* and the SFE 21*n* are turned on. Charges corresponding to the signal Sin and the signal/Sin are thus charged in the capacitors 213_0 of the SFE 21*p* and the SFE 21*n*. In periods (periods H1_8, H1_16, and H1_24 in FIG. 8) when the signal level of the signal CK1_0 in the second, third, and fourth cycles is "L" level, the switching elements 212_0 of the SFE 21*p* and the SFE 21*n* are turned off. In the period when the switching element 212_0 is in the OFF state, the buffer 214_0 holds the voltage value charged in the capacitor 213_0.

The periods H1_8, H1_16, and H1_24 include periods (periods T2_8, T2_16, and T2_24 in FIG. 8) when the signals CK2_8, CK2_16, and CK2_24 have "H" level, respectively. In the periods T2_8, T2_16, and T2_24, the switching elements 221*p*_8 and 221*n*_8 of the SAR-ADC 22_8, the switching elements 221*p*_16 and 221*n*_16 of the SAR-ADC 22_16, and the switching elements 221*p*_24 and 221*n*_24 of the SAR-ADC 22_24 are turned on, respectively. The charges held by the buffer 214_0 of each of the SFE 21*p* and the SFE 21*n* are thus charged in a plurality of capacitors of the CDAC 222_8 in the period T2_8, in a plurality of capacitors of the CDAC 222_16 in the period T2_16, and in a plurality of capacitors of the CDAC 222_24 in the period T2_24, respectively.

After that, in periods (periods H2_8, H2_16, and H2_24 in FIG. 8) when the signals CK2_8, CK2_16, and CK2_14 have "L" level, the switching elements 221*p*_8 and 221*n*_8 of the SAR-ADC 22_8, the switching elements 221*p*_16 and 221*n*_16 of the SAR-ADC 22_16, and the switching elements 221*p*_24 and 221*n*_24 of the SAR-ADC 22_24 are turned off, respectively. In the periods H2_8, H2_16, and H2_24, the CDACs 222_8, 222_16, and 222_24 hold the charges charged in the plurality of capacitors of the CDACs 222, respectively. The held charges are stored over the periods H2_8, H2_16, and H2_24, respectively. Using the held charges, the bit strings X0 8<7:0>, X0 16<7:0>, and X0 24<7:0> are sequentially determined from the most significant bit to the least significant bit in each of the periods H2_8, H2_16, and H2_24, respectively.

(b-2) Determination Processing

Determination processing of the determination processing circuit 900 in an operation example of the semiconductor integrated circuit 22 according to this embodiment will be described with reference to FIGS. 9, 10, 11, 12, 13, 14, 15, 16, and 17. Determination processing for the 8-bit bit string (data) X0_*j* will be described here. In this case, the value "m" in FIG. 5 is 8.

(b-2-1) Example 1

Figure 9:
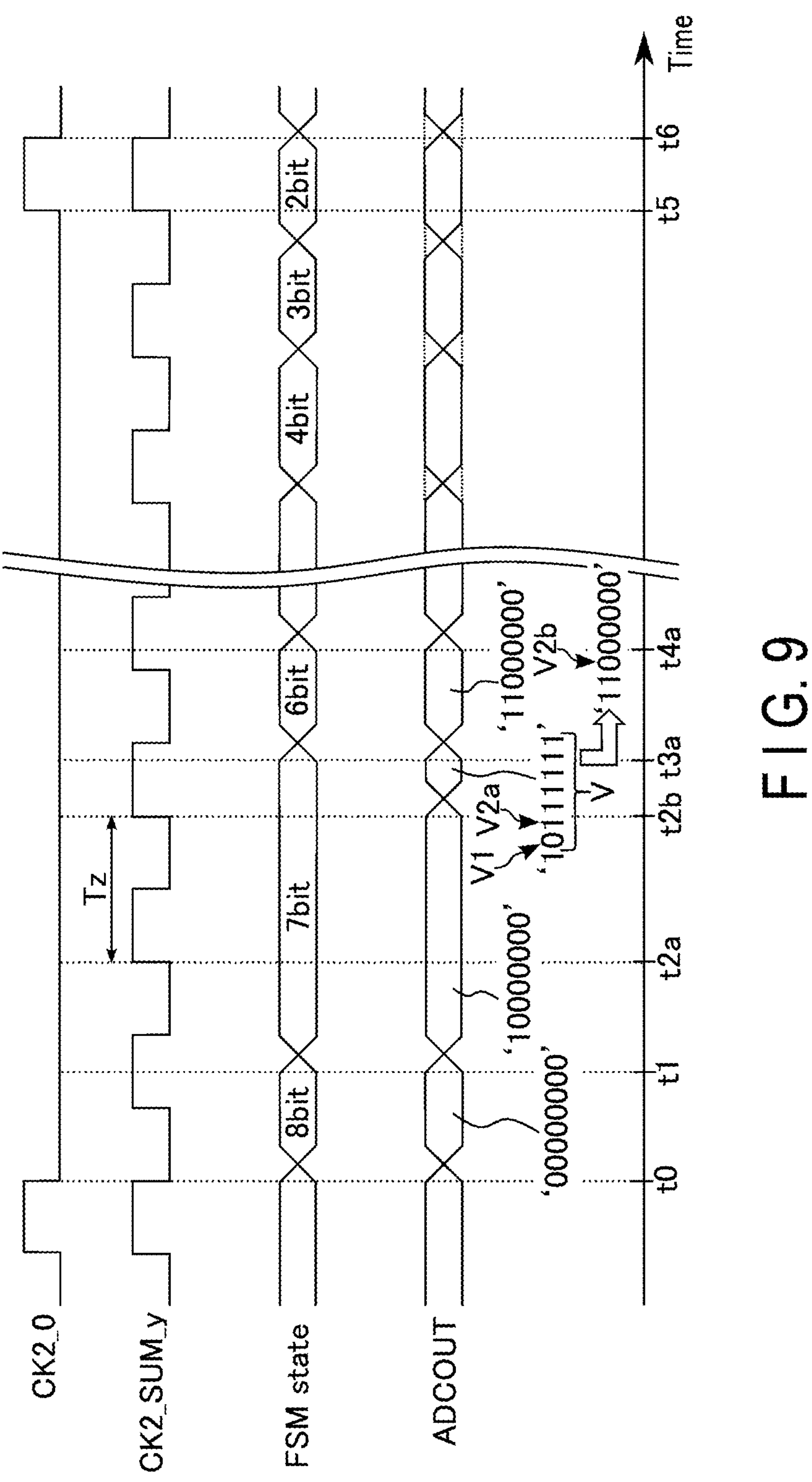
FIG. 9 is a timing chart for explaining an example of an operation of the semiconductor integrated circuit according to the first embodiment.

FIG. 9 is a timing chart showing Example 1 of determination processing of the determination processing circuit 900 in the operation example of the semiconductor integrated circuit 22 according to this embodiment. The abscissa of FIG. 9 corresponds to time. The ordinate of FIG. 9 corresponds to the signal level of each signal.

<Time t0>

At time t0 in FIG. 9, the TI-ADC circuit 20 starts the SAR operation by the SAR-ADC 22_*j*. Here, "j" is 0 as an example. Note that "H" level corresponds to a value "1", and "L" level corresponds to a value "0".

If x=0, the OR gate 910 shown in FIG. 5 performs an OR operation of the plurality of signals CK2_0, CK2_8, CK2_16, and CK2_24, thereby generating the signal CK2_SUM_y. The generated signal CK2_SUM_y is supplied to the state confirmation circuits 940. Each state confirmation circuit 940 can confirm, based on the cycle of the signal CK2_SUM_y, whether the operation state of determination of the target bit is the metastable state.

Figure 10:
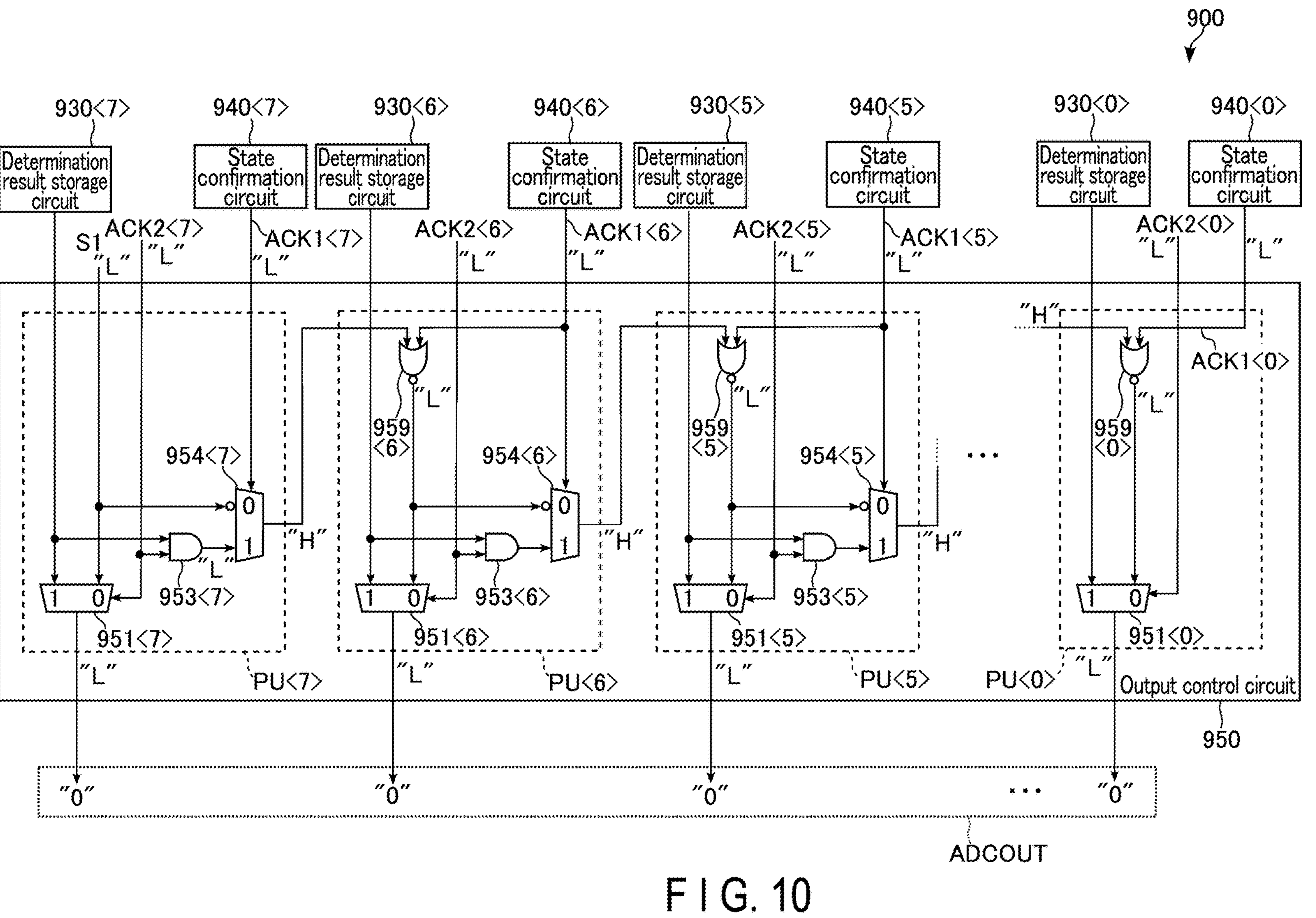
FIG. 10 is a schematic view showing a state of the operation of the semiconductor integrated circuit according to the first embodiment.

FIG. 10 is a schematic view for explaining the operation state of the determination processing circuit 900 in bit string determination processing in the semiconductor integrated circuit 22 according to this embodiment. As shown in FIG. 10, each of the plurality of processing units PU of the output control circuit 950 receives the metastable notification signal ACK1 concerning the corresponding bit and the determination end notification signal ACK2 concerning the corresponding bit.

At the start of determination processing of the bit string X0_0 in the SAR operation, since the FSM 920 and the state confirmation circuits 940 do not detect the possibility of the metastable state in the determination of each bit, each of the metastable notification signals ACK1<7>, . . . , and ACK1<0> concerning the bits has a signal level of "L" level. At the start of determination processing of the bit string X0_0 in the SAR operation, each of the determination end notification signals ACK2<7>, . . . , and ACK2<0> concerning the bits has a signal level of "L" level.

At the start of determination processing of the bit string X0_0 in the SAR operation, each of the plurality of determination result storage circuits 930 stores the value "$_{0}$" as the initial value.

The signal S1 is supplied, as a reference signal for internal control of the output control circuit 950, to the processing unit PU<7> corresponding to the most significant bit that is the first stage of the determination processing. When executing the SAR operation, the signal S1 has a signal level of "L" level. The value (signal level) of a temporary value to be set for each bit can be controlled in accordance with the signal level of the signal S1.

In the processing unit PU<7>, the selector 951<7> selects one of the signal S1 and the signal from the determination result storage circuit 930<7> based on the determination end notification signal ACK2<7>. The selector 951<7> selects the signal S1 based on the determination end notification signal ACK2<7> of "L" level. The selector 951<7> outputs a signal of "L" level. The value "0" that is the initial set value is thus set concerning the eighth bit.

The AND gate 953<7> executes an AND operation of the determination end notification signal ACK2<7> and the signal from the determination result storage circuit 930<7>. The AND gate 953<7> outputs the result of the AND operation to the selector 954<7>. The AND gate 953<7> outputs a signal of "L" level by the AND operation of the determination end notification signal ACK2<7> of "L" level and the signal (initial value) of "L" level from the determination result storage circuit 930<7>. Note that if the signal level of the determination end notification signal ACK2 is "L" level, the signal level of the signal output from the AND gate 953 is "L" level independently of the signal level of the signal of the determination result storage circuit 930.

The selector 954<7> receives the signal output from the AND gate 953 by the input node of positive logic. The selector 954<7> receives the signal S1 of “L” level by the input node of negative logic. The signal level of the signal supplied to the input node of negative logic is inverted. The selector 954<7> selects one of the signal from the AND gate 953 and the signal S1 based on the metastable notification signal ACK1.

The metastable notification signal ACK1<7> of “L” level is supplied to the selector 954<7>. The selector 954<7> selects the inverted signal of the signal S1 based on the metastable notification signal ACK1<7> of “L” level. The selector 954<7> outputs the inverted signal of the signal S1. A signal of “H” level is output from the selector 954<7>.

In the output control circuit 950, the processing unit PU<6> of the seventh bit of the next stage receives the signal of “H” level from the selector 954<7> of the processing unit PU<7> of the preceding stage.

The signal of “H” level is supplied to the first input node of the NOR gate 959<6> of the processing unit PU<6>. The metastable notification signal ACK1<6> of “L” level is supplied to the second input node of the NOR gate 959<6>.

The NOR gate 959<6> outputs a signal of “L” level based on the result of a NOR operation of the signal of “H” level and the metastable notification signal ACK1<6> of “L” level.

The signal of “L” level is supplied from the NOR gate 959<6> to the second input node of the selector 951<6>. A signal from the determination result storage circuit 930<6> is supplied to the first input node of the selector 951<6>.

The selector 951<6> selects one of the signal from the NOR gate 959<6> and the signal from the determination result storage circuit 930<6> based on the determination end notification signal ACK2<6>. The determination end notification signal ACK2<6> has “L” level. The selector 951<6> selects the signal from the NOR gate 959<6> based on the determination end notification signal ACK2<6> of “L” level. The signal of “L” level is output from the selector 951<6>. The value “0” that is the initial set value is thus set concerning the seventh bit.

The AND gate 953<6> executes an AND operation of the determination end notification signal ACK2<6> and the signal from the determination result storage circuit 930<6>. The signal level of the determination end notification signal ACK2<6> is “L” level. Hence, the result of the AND operation is “L” level. The AND gate 953<6> sends the signal of “L” level to the selector 954<6>.

The selector 954<6> receives the signal of “L” level from the AND gate 953<6> by the input node of positive logic. The selector 954<6> receives the signal of “L” level from the NOR gate 959<6> by the input node of negative logic. The selector 954<6> selects the signal from the NOR gate 959<6> based on the metastable notification signal ACK1<6> of “L” level. The signal from the NOR gate 959<6> is inverted by the input to the input node of negative logic of the selector 954<6>. The selector 954<6> sends a signal of “H” level to the processing unit PU<5> of the subsequent stage.

Each of the processing units PU<5>, . . . , and PU<0> concerning the sixth to first bits executes substantially the same operation as the operation of the processing unit PU<6> concerning the seventh bit. The value “0” that is the initial set value is thus set concerning each of the sixth to first bits.

As a result, as shown in FIG. 9, at time t0, the output control circuit 950 outputs a digital value ADCOUT of “00000000” that is the initial set value (to be also referred to as the initial digital value hereinafter).

<Time t1>

Figure 11:
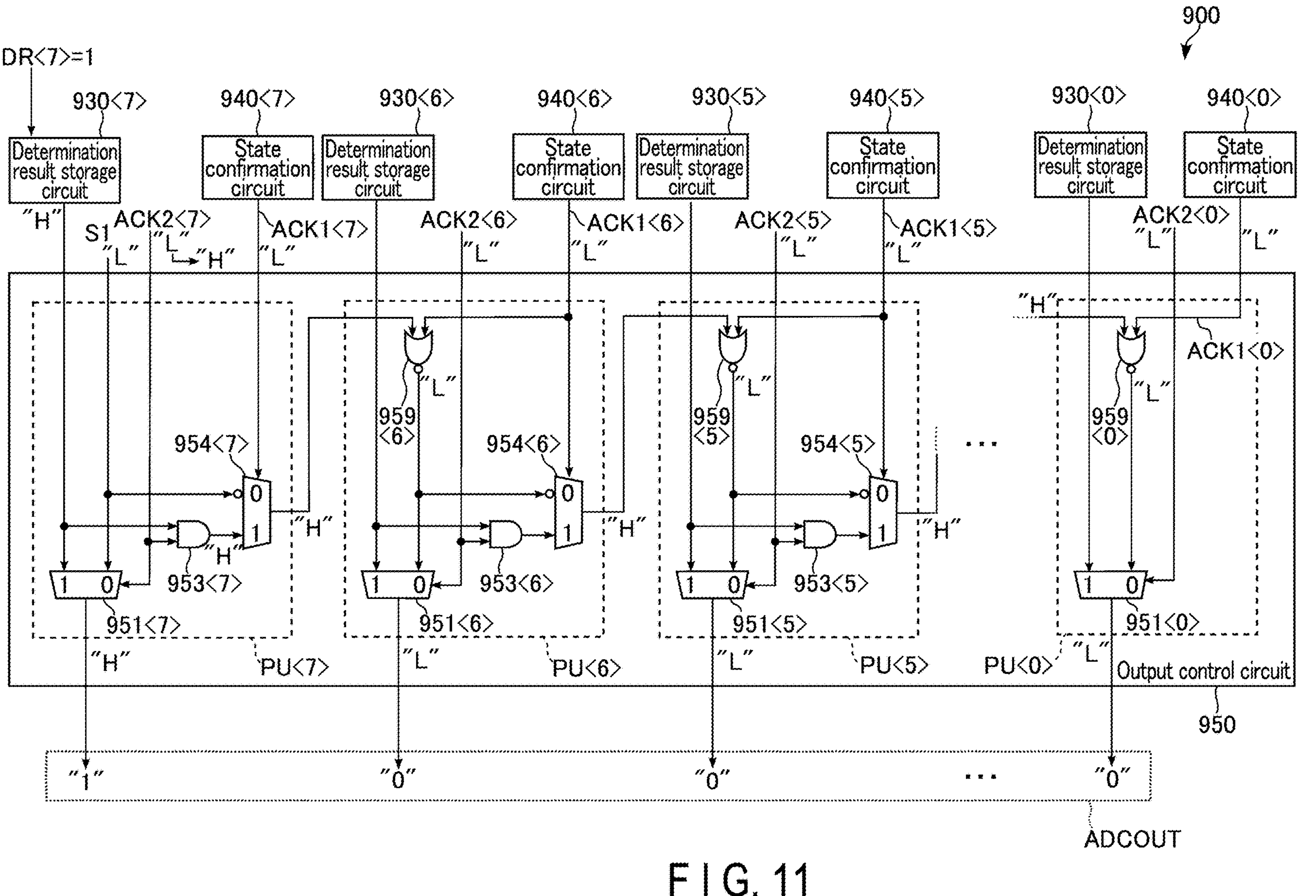
FIG. 11 is a schematic view showing another state of the operation of the semiconductor integrated circuit according to the first embodiment.

FIG. 11 is a schematic view for explaining the operation state of the determination processing circuit 900 in bit string determination processing in the semiconductor integrated circuit 22 according to this embodiment.

At time t1 in FIG. 9, the bit value of the eighth bit of the determination target is decided based on evaluation and determination by comparison processing of the comparator 223_0. For example, the bit value of the eighth bit is “1”.

As shown in FIG. 11, a signal DR<7> indicating the determination result of the eighth bit is supplied to the corresponding determination result storage circuit 930<7>. The determination result storage circuit 930<7> stores the bit value (determination value) of “1”.

The FSM 920 changes the signal level of the determination end notification signal ACK2<7> from “L” level to “H” level based on the signals Qp and Qn from the comparator 223_0 and the signal RY (signal CKa) from the NOR gate 224_0. The determination end notification signal ACK2<7> of “H” level is supplied to the control node of the selector 951<7>. The signal level of the determination end notification signals ACK2<6>, . . . , and ACK2<0> concerning the remaining bits is maintained at “L” level.

The selector 951<7> selects the signal from the determination result storage circuit 930<7> based on the determination end notification signal ACK2 of “H” level. The selector 951<7> thus outputs the signal of “H” level corresponding to the bit value “1” in the determination result storage circuit 930.

The AND gate 953<7> executes an AND operation of the signal of “H” level from the determination result storage circuit 930<7> and the determination end notification signal ACK2<7> of “H” level. The AND gate 953<7> supplies a signal of “H” level to the selector 954<7> based on the result of the AND operation. Note that if the signal level of the determination end notification signal ACK2 is “H” level, the signal level of the signal output from the AND gate 953 has a value according to the signal level of the signal from the determination result storage circuit 930.

If the bit value determination is ended without the occurrence of the metastable state, like the bit determination of the eighth bit, the metastable notification signal ACK1<7> maintains the signal level of “L” level.

The selector 954<7> selects the signal S1 based on the metastable notification signal ACK1<7> of “L” level. The selector 954<7> thus outputs the signal of “H” level that is the inverted signal of the signal S1.

The signal output from the selector 954<7> is supplied to the NOR gate 959<6> of the processing unit PU<6> of the subsequent stage.

The determination target bit changes from the eighth bit to the seventh bit of the bit string X0_0. The FSM 920 recognizes that the determination target bit is the seventh bit.

In the processing unit PU<6> concerning the seventh bit, the NOR gate 959<6> executes a NOR operation of the signal of “H” level and the metastable notification signal ACK1<6> of “L” level. The NOR gate 959<6> outputs a signal of “L” level.

The selector 951<6> selects the signal from the NOR gate 959<6> based on the determination end notification signal ACK2<6> of “L” level. The selector 951<6> outputs the signal of “L” level.

The output control circuit 950 thus outputs the bit value “0” that is the initial set value concerning the seventh bit of the bit string.

Each of the processing units PU<5>, . . . , and PU<0> of the sixth to first bits performs substantially the same operation as the operation of the processing unit PU<6> concerning the seventh bit.

As a result, the output control circuit 950 outputs the digital value ADCOUT of "10000000".

<Time t2*a* and Time t2*b*>

Figure 12:
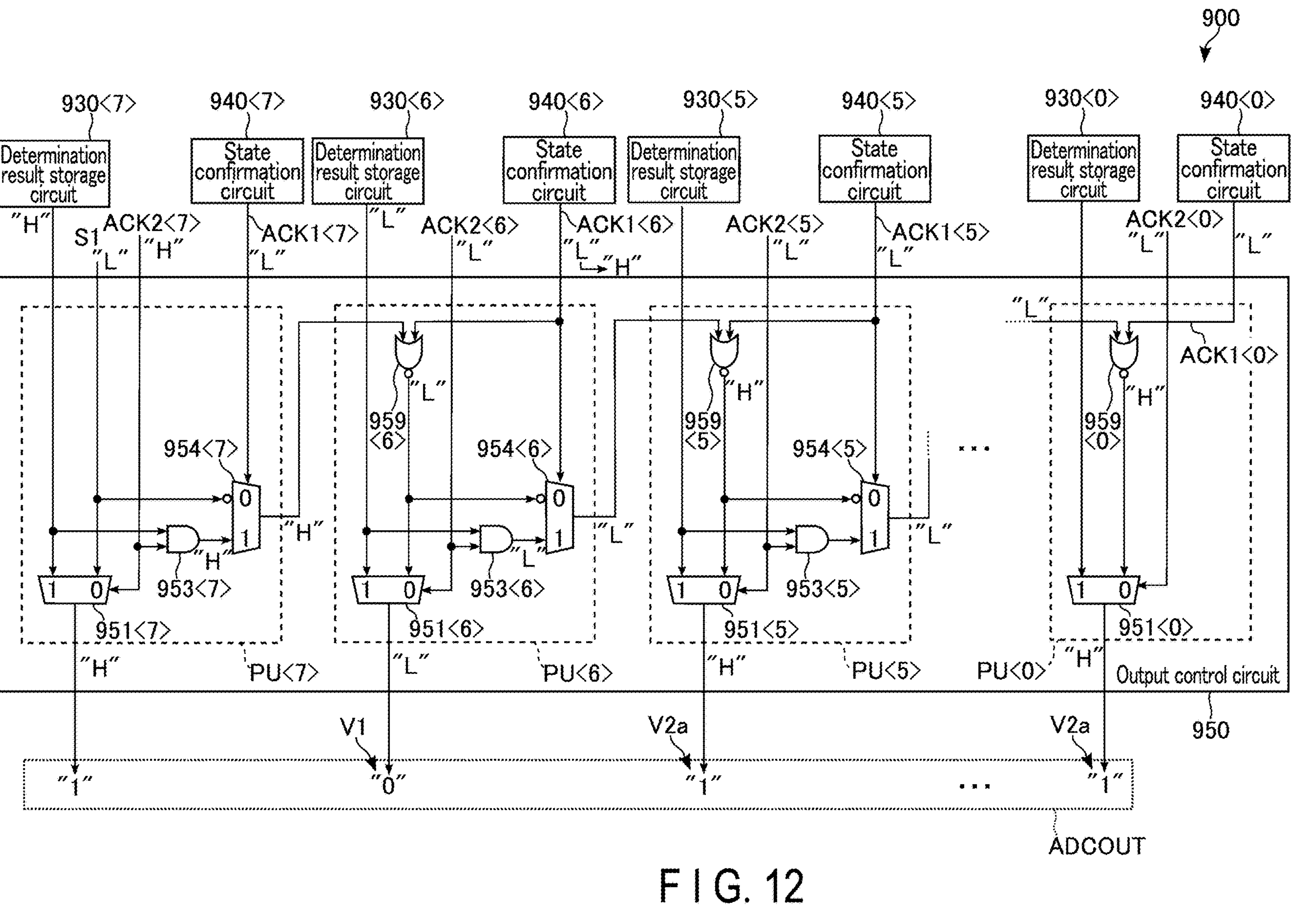
FIG. 12 is a schematic view showing still another state of the operation of the semiconductor integrated circuit according to the first embodiment.

FIG. 12 is a schematic view for explaining the operation state of the determination processing circuit 900 in bit string determination processing in the semiconductor integrated circuit 22 according to this embodiment.

During the SAR operation, the FSM 920 supplies a signal indicating the state of determination processing of the determination target bit by the comparator 223_0 to the corresponding to state confirmation circuit 940 based on the signals RY, Qn, and Qp.

The state confirmation circuit 940 latches the signal from the FSM 920 at a timing synchronized with the rising edge of the signal CK2_SUM_y.

At each of time t2*a* and time t2*b* during the determination processing of the seventh bit shown in FIG. 9, a rising edge of the clock of the signal CK2_SUM_y occurs. A period Tz from the rising edge of the first clock of the signal CK2_SUM_y at time t2*a* to the rising edge of the second clock of the signal CK2_SUM_y at time t2*b* corresponds to one cycle of the signal CK2_SUM_y that is a clock signal.

At each of times t2*a* and t2*b*, a signal indicating that the determination processing of the seventh bit is being performed (a signal indicating that the determination processing is not ended) is supplied from the FSM 920 to the state confirmation circuit 940<6>.

In a period from the time of start of determination to a certain time during the determination processing of the seventh bit, if signals acquired in the state confirmation circuit 940 at timings synchronized with the two rising edges of the signal CK2_SUM_y indicate that the determination processing is being performed, the value in the state confirmation circuit 940 changes to a value indicating the metastable state. The state confirmation circuit 940 can thus confirm that the determination processing concerning the seventh bit is in the metastable state.

For example, in the state confirmation circuit 940<m−1 (=6)> shown in FIG. 6, the flip-flop 943*a* latches the signal of "H" level from the FSM 920 at the timing of the first rising edge of the signal CK2_SUM_y at time t2*a*. At the timing of the second rising edge of the signal CK2_SUM_y at time t2*b*, the flip-flop 943*a* latches the signal of "H" level from the FSM 920 and sends the internal signal of "H" level to the flip-flop 944*a*. At the timing of the second rising edge at time t2*b*, the flip-flop 944*a* latches the signal of "H" level from the flip-flop 943*a*. The AND gate 946*a* outputs a signal of "H" level to the OR gate 947*a* based on the result of an AND operation for the signals of "H" level from the flip-flops 943*a* and 944*a*. The OR gate 947*a* outputs a signal ACK1<m−1(=6)> of "H" level based on the result of an OR operation using the signal of "H" level from the AND gate 946*a*.

As a result, the signal level of the metastable notification signal ACK1<6> changes from "L" level to "H" level. The state confirmation circuit 940 outputs the metastable notification signal ACK1<6> having a signal level of "H" level.

At time t2*b*, as shown in FIG. 12, the NOR gate 959<6> receives the metastable notification signal ACK1<6> of "H" level. The NOR gate 959<6> receives a signal of "H" level from the selector 954<7> of the processing unit PU<7> of the preceding stage. Hence, the NOR gate 959<6> outputs a signal of "L" level based on the result of a NOR operation using the two signal of "H" level.

The determination end notification signal ACK2<6> of "L" level is supplied to the control node of the selector 951<6>.

The selector 951<6> selects the signal from the NOR gate 959<6> based on the determination end notification signal ACK2<6> of "L" level. The selector 951<6> thus outputs the signal of "L" level from the NOR gate 959<6>. The signal of "L" level output from the selector 951<6> includes a temporary value V1 set for the seventh bit. In this way, the signal output from the selector 951<6> is changed from a signal including the initial set value to a signal including the temporary value V1.

The AND gate 953<6> executes an AND operation of the signal of "L" level of the determination result storage circuit 930<6> and the determination end notification signal ACK2<6> of "L" level. The AND gate 953<6> supplies a signal of "L" level to the input node of positive logic of the selector 954<6> based on the result of the AND operation.

The NOR gate 959<6> supplies a signal of "L" level to the input node of negative logic of the selector 954<6>.

The selector 954<6> selects the signal from the AND gate 953<6> based on the metastable notification signal ACK1<6> of "H" level. The selector 954<6> thus outputs the signal of "L" level from the AND gate 953<6>.

The signal of "L" level from the selector 954<6> is supplied to the NOR gate 959<5> of the processing unit PU<5> of the subsequent stage.

In the processing unit PU<5> of the sixth bit, the NOR gate 959<5> receives the signal of "L" level from the processing unit PU<6> of the seventh bit and the metastable notification signal ACK1<5> of "L" level. The NOR gate 959<5> outputs a signal of "H" level by a NOR operation.

The selector 951<5> selects the signal from the NOR gate 959<5> based on the determination end notification signal ACK2<5> of "L" level. The selector 951<5> outputs a signal of "H" level. The signal of "H" level output from the selector 951<5> includes a temporary value V2*a* set for the sixth bit.

The selector 954<5> selects the signal from the NOR gate 959<5> based on the metastable notification signal ACK1<5> of "L" level. The selector 954<5> thus outputs a signal of "L" level that is the inverted signal of the signal from the NOR gate 959<5>.

Each of the processing units PU<4>, . . . , and PU<0> of the fifth to first bits performs substantially the same operation as the operation of the processing unit PU<5> of the sixth bit. Each of the processing units PU<4>, . . . , and PU<0> of the fifth to first bits outputs a signal of "H" level. The signal output from each of the processing units PU<4>, . . . , and PU<0> includes the temporary value V2*a*.

As a result, the output control circuit 950 outputs the digital value ADCOUT of "10111111". Of the output digital value ADCOUT, values of "0111111" other than the most significant bit are temporary values V.

As described above, if the determination of the value of the determination target bit is not ended even if a period more than one cycle (period Tz) of the signal CK2_SUM_y has elapsed during the determination period of a certain bit, the temporary value V1 is set to the value of the determination target bit. In synchronism with the setting of the temporary value for the determination target bit, the temporary value V2*a* is set for the bits lower than the determination target bit. If the temporary value is a digital value including a plurality of bits, the value V2*a* of one or more lower bits in the temporary value is different from the temporary value V2 of the most significant bit in the temporary value. For example, in a temporary value including a plurality of bits, the most significant bit of the temporary value is set to a value "0". One or more bits from the second bit of the temporary value are set to a value "1".

<Time t3a>

Figure 13:
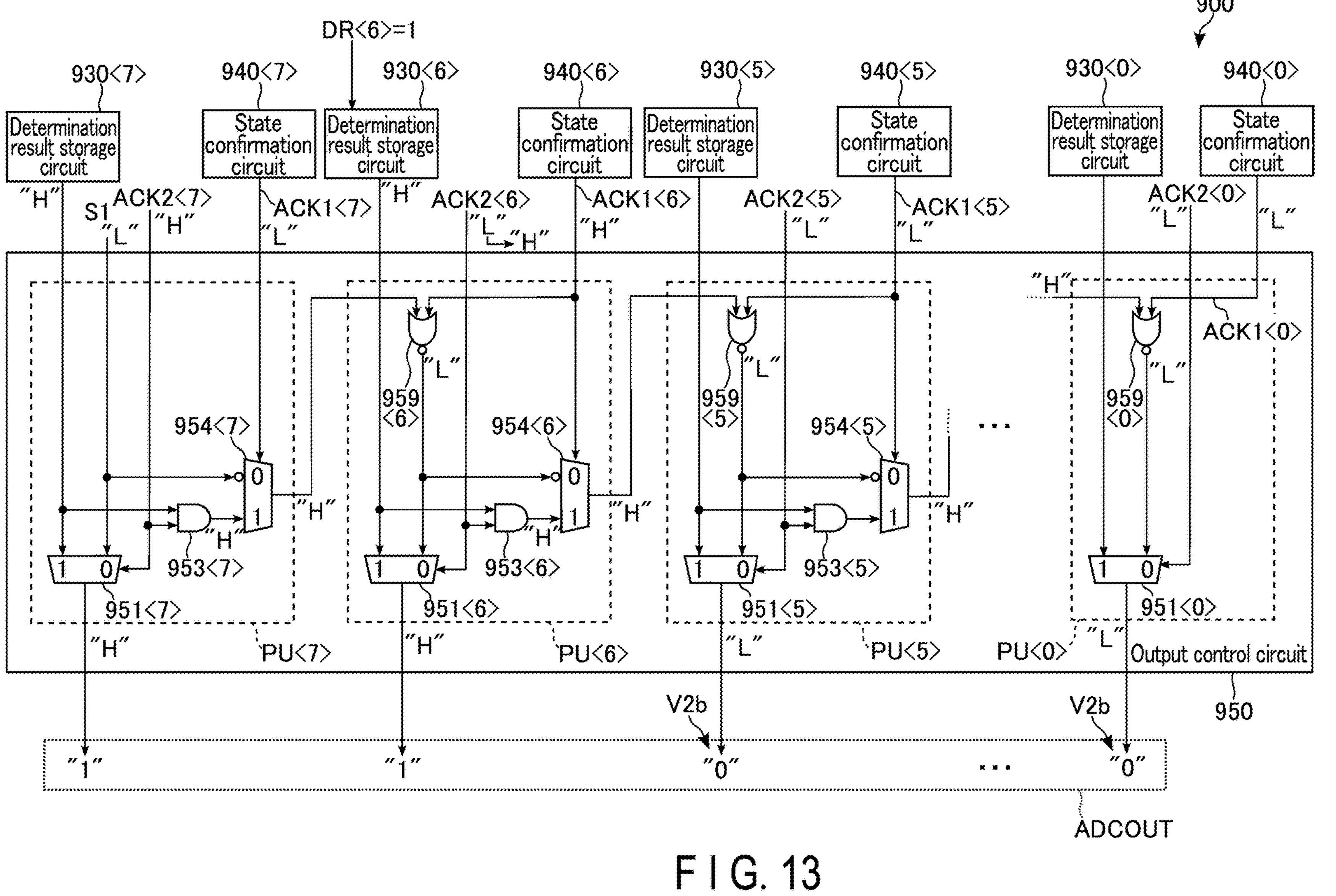
FIG. 13 is a schematic view showing yet another state of the operation of the semiconductor integrated circuit according to the first embodiment.

FIG. 13 is a schematic view for explaining the operation state of the determination processing circuit 900 in bit string determination processing in the semiconductor integrated circuit 22 according to this embodiment.

At time t3a shown in FIG. 9, the bit value of the seventh bit of the determination target is decided. For example, the bit value of the seventh bit is "1". The FSM 920 detects the end of the determination of the seventh bit based on the signals Qp and Qn from the comparator 223_0 and the signal RY (signal CKa) from the NOR gate 224_0.

As shown in FIG. 13, the determination result DR<6> of "1" is supplied to the corresponding determination result storage circuit 930<6>. The determination result storage circuit 930<6> stores the bit value "1".

The signal level of the determination end notification signal ACK2<6> changes from "L" level to "H" level. The determination end notification signal ACK2<6> of "H" level is supplied to the control node of the selector 951<6>.

The selector 951<6> selects the signal from the determination result storage circuit 930<6> based on the determination end notification signal ACK2<6> of "H" level. The selector 951<6> thus outputs a signal of "H" level corresponding to the bit value "1" from the determination result storage circuit 930<6>.

In this way, in the processing unit PU<6> of the seventh bit, the signal output from the selector 951<6> changes from the signal of "L" level to the signal of "H" level.

The AND gate 953<6> executes an AND operation of the signal of "H" level from the determination result storage circuit 930<6> and the determination end notification signal ACK2<6> of "H" level. The AND gate 953<6> supplies a signal of "H" level to the selector 954<6> based on the result of the AND operation.

The selector 954<6> receives the signal of "H" level from the AND gate 953<6> by the input node of positive logic. The selector 954<6> receives the signal of "L" level from the NOR gate 959<6> by the input node of negative logic.

Even if the determination of the bit value of the seventh bit is ended, the signal level of the metastable notification signal ACK1<6> concerning the processing unit PU<6> of the seventh bit is maintained at "H" level.

For example, in the state confirmation circuit 940 shown in FIG. 6, if it is confirmed that the state of the determination of the corresponding bit is the metastable state, the flip-flop 945a continues storing the signal of "H" level even if the signal level of the signal supplied from the FSM 920 in accordance with the end of the determination of the corresponding bit is set to "L" level. For this reason, even if the determination of the corresponding bit is ended, the metastable notification signal ACK1<m−1> of "H" level is output from the OR gate 947a.

That is, as shown in FIG. 13, the selector 954<6> selects the inverted signal of the signal from the AND gate 953<6> based on the metastable notification signal ACK1<6> of "H" level. The selector 954<6> thus outputs a signal of "H" level.

The signal of "H" level from the selector 954<6> is supplied to the NOR gate 959<5> of the processing unit PU<5> of the subsequent stage.

The determination target bit in the bit string X0_0 changes from the seventh bit to the sixth bit. The FSM 920 recognizes that the determination target bit is the sixth bit.

In the processing unit PU<5> concerning the sixth bit, the NOR gate 959<5> executes a NOR operation of the signal of "H" level and the metastable notification signal ACK1<5> of "L" level. The NOR gate 959<5> outputs a signal of "L" level.

The selector 951<5> selects the signal from the NOR gate 959<5> based on the determination end notification signal ACK2<5> of "L" level. The selector 951<5> outputs the signal of "L" level. When the bit value of the seventh bit that has undergone the determination changes from "0" to "1", a temporary value V2b set for the sixth bit changes from "1" to "O".

Concerning the sixth bit of the bit string, the determination result storage circuit 930<5> stores the value "0" as the initial value before the end of the determination of the sixth bit. The determination result storage circuit 930<5> outputs a signal of "L" level.

The AND gate 953<5> outputs a signal of "L" level based on the result of an AND operation of the signal of "L" level from the determination result storage circuit 930<5> and the determination end notification signal ACK2<5> of "L" level.

The selector 954<5> selects the signal from the NOR gate 959<5> based on the metastable notification signal ACK1<5> of "L" level. The selector 954<5> sends a signal of "H" level to the processing unit PU<4> of the subsequent stage.

Each of the processing units PU<4>, . . . , and PU<0> from the fifth to first bits outputs a signal of "L" level corresponding to the bit value "0" from the selector 951 based on the signal of "H" level from the NOR gate 959 of the processing unit PU of the preceding stage, the metastable notification signal ACK1 of "L" level, and the determination end notification signal ACK2 of "L" level.

The output control circuit 950 thus outputs the digital value ADCOUT of "11000000" including temporary values from the sixth to first bits. The bit value of the seventh bit changes from the temporary value V1 of "0" to the value "1" according to the determination result DR<6>. The temporary value V2b of each of the sixth to first bits changes from "1" to "0".

In this way, in accordance with the bit value decided by the end of the determination of a certain bit in the metastable state, the value of the temporary value set for a bit lower than the certain bit in the metastable state is changed.

<Time t4a>

Figure 14:
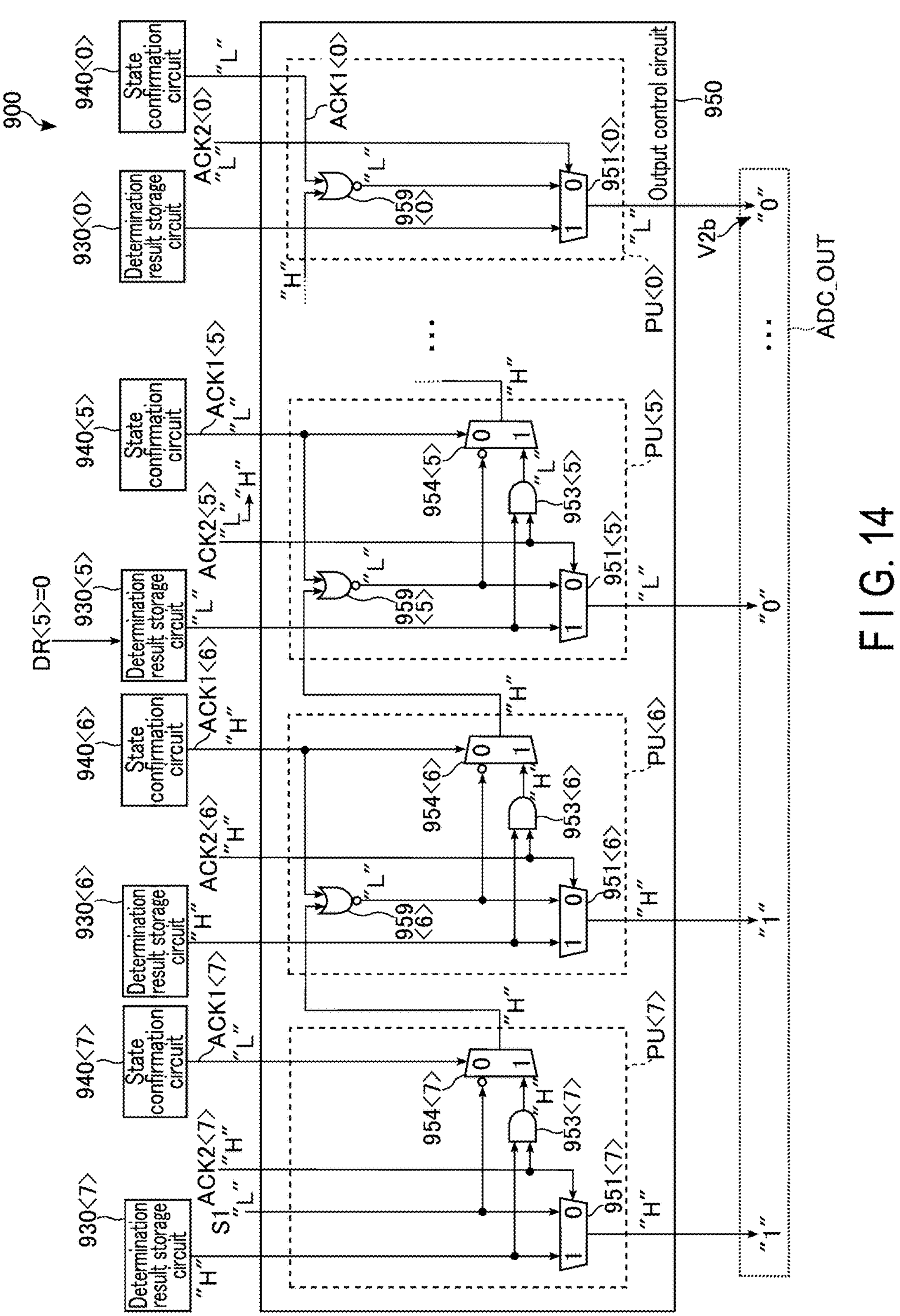
FIG. 14 is a schematic view showing still another state of the operation of the semiconductor integrated circuit according to the first embodiment.

FIG. 14 is a schematic view for explaining the operation state of the determination processing circuit 900 in bit string determination processing in the semiconductor integrated circuit 22 according to this embodiment.

At time t4a shown in FIG. 9, the determination of the bit value of the sixth bit is ended without the occurrence of the metastable state. The FSM 920 detects the end of the determination of the sixth bit in accordance with the signals Qp and Qn and the signal RY (signal CKa).

As shown in FIG. 14, for example, if the determined bit value of the sixth bit is "0", the determination result DR<5> of "0" is stored in the determination result storage circuit 930<5> associated with the sixth bit.

The signal level of the determination end notification signal ACK2<5> concerning the sixth bit changes from "L" level to "H" level.

The selector 951<5> outputs a signal having a signal level according to the value in the determination result storage circuit 930<5> based on the determination end notification signal ACK2<5> of “H” level. A signal of “L” level is output from the selector 951<5>.

In accordance with the end of the bit determination of the sixth bit, a signal of “L” level corresponding to the determination result is supplied from the determination result storage circuit 930<5> to the AND gate 953<5>.

The AND gate 953<5> supplies a signal of “L” level to the selector 954<5> based on the result of an AND operation of the signal of the “L” level from the determination result storage circuit 930<5> and the determination end notification signal ACK2 of “H” level.

The NOR gate 959<5> outputs a signal of “L” level by a NOR operation of the signal of “H” level and the metastable notification signal ACK1<5> of “L” level.

The selector 954<5> selects the inverted signal of the signal from the NOR gate 959<5> based on the metastable notification signal ACK1<5> of “L” level. The selector 954<5> sends a signal of “H” level to the processing unit PU<4> of the fifth bit.

In the processing unit PU<4> of the fifth bit, the NOR gate 959<4> receives the signal of “H” level from the processing unit PU<5> of the sixth bit. The NOR gate 959<4> outputs a signal of “L” level by a NOR operation of the signal of “H” level and the metastable notification signal ACK1<4> of “L” level.

The selector 951<4> selects the signal from the NOR gate 959<4> based on the determination end notification signal ACK2<4> of “L” level. The selector 951<4> thus outputs the signal of “L” level from the NOR gate 959<4>.

The AND gate 953<4> and the selector 954<4> receive signals similar to those for the AND gate 953<5> and the selector 954<5> of the processing unit PU<5> of the sixth bit and output similar signals. That is, the selector 954<4> outputs a signal of “H” level. The signal of “H” level is thus supplied to the NOR gate 959<3> of the processing unit PU<3> of the fourth bit of the subsequent stage.

Each of the processing units PU<3>, . . . , and PU<0> of the fourth to first bits operates based on the signal of “H” level from the processing unit PU of the preceding stage, the metastable notification signal ACK1 of “L” level, and the determination end notification signal ACK2 of “L” level. The output control circuit 950 thus outputs the digital value ADCOUT of “11000000” including temporary values from the fifth to first bits.

After that, in each of the processing units PU<3>, . . . , and PU<0>, if the state of bit determination is not the metastable state, the processing unit PU corresponding to the determination target bit outputs a signal corresponding to the value in the determination result storage circuit 930, substantially like the operation of the processing unit PU<5> of the sixth bit in FIGS. 13 and 14.

In each of the processing units PU<3>, . . . , and PU<0>, if the state during the determination of the bit value is the metastable state, the processing unit PU corresponding to the determination target bit temporarily sets a temporary value in the corresponding bit, like the operation of the processing unit PU<6> of the seventh bit in FIG. 12.

<Times t5 and t6>

As shown in FIG. 9, at time t5, the signal level of the signal CK2_0 changes from “L” level to “H” level. The SAR operation of the SAR-ADC 22_0 ends in synchronism with the rising edge of the signal CK2_0. The digital value of the bit string output from the output control circuit 950 is thus fixed. The output control circuit 950 outputs a bit string including the fixed digital value to the plurality of flip-flops 991<7>, . . . , and 991<0> of the subsequent stage.

For example, the flip-flops 943*a*, 944*a*, and 945*a* in the state confirmation circuit 940 are set in the reset state at a timing according to the rising edge of the signal CK2_0.

At time t6, the signal level of the signal CK2_0 changes from “H” level to “L” level.

Each of the flip-flops 991<7>, . . . , and 991<0> receives the falling edge of the signal CK2_0 by the clock node of negative logic. Each of the flip-flops 991<7>, . . . , and 991<0> latches a signal output from a corresponding one of the processing units PU<7>, . . . , and PU<0> of the output control circuit 950 based on a timing according to transition of the signal level of the signal CK2_0 from “H” level to “L” level.

The digital value of the bit string obtained by the SAR operation is thus stored in the flip-flop 991.

The digital value stored in the flip-flop 991 is supplied as the bit string (data) X0_0 obtained by the SAR operation to the DSP circuit 40 of the subsequent stage.

If determination of one or more bit values on the least significant bit side among the plurality of bits included in the bit string is not ended within the period of the SAR operation based on the cycle of the signal CK2_0, the output control circuit 950 outputs, to the flip-flop 991, a bit string of eight bits including temporary values in the bits for which the bit determination is not ended. As a result, each bit value for which the determination is not ended is set to the temporary value and stored in the flip-flop 991 in this state.

For example, if the bit determination is ended only for the eighth to second bits of the bit string X0_0 during the above-described SAR operation, the value of the least significant first bit is a temporary value set in accordance with the determination processing of an upper bit.

As described above, in this embodiment, if evaluation and determination of all the plurality of bits included in the bit string are not ended by the SAR operation, the determination processing circuit 900 outputs a digital value including a temporary value as the value of the bit string of the determination target.

(b-2-2) Example 2

Another example of the operation of the semiconductor integrated circuit 22 according to this embodiment will be described with reference to FIGS. 15, 16, and 17.

Figure 15:
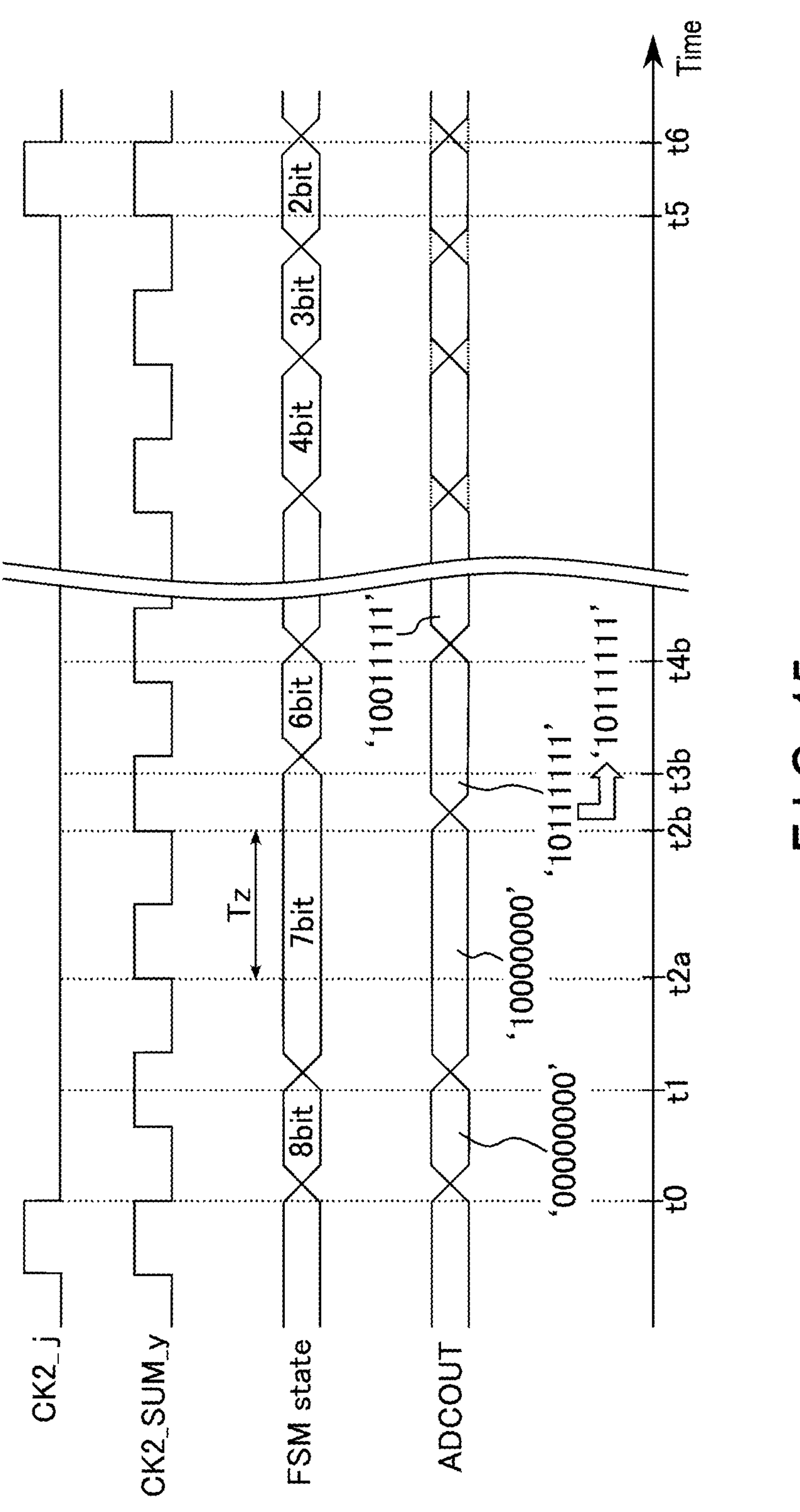
FIG. 15 is a timing chart for explaining another example of the operation of the semiconductor integrated circuit according to the first embodiment.

FIG. 15 is a timing chart for explaining Example 2 of the operation of the semiconductor integrated circuit according to this embodiment.

<Times t0 and t1>

As shown in FIG. 15, at time t0, the SAR-ADC 22_*j* starts the SAR operation in accordance with the falling edge of the signal CK2_*j*, like the example shown in FIG. 9.

At time t1, in the processing unit PU<7> of the eighth bit, the bit value of the eighth bit of the bit string is decided, like the operation shown in FIG. 10 described above.

After that, in the processing unit PU<6> of the seventh bit, processing associated with setting of the bit value of the seventh bit is executed.

<Times t2*a* and t2*b*>

At each of times t2*a* and t2*b* during the determination period of the bit value of the seventh bit, a rising edge of the signal CK2_SUM_y occurs. Hence, the corresponding state confirmation circuit 940<6> confirms that the state of bit determination of the seventh bit is the metastable state.

In this case, in the processing unit PU<6> of the seventh bit, the value “0” is set as a temporary value to the bit value of the seventh bit, substantially like the above-described operation of the processing unit PU<6> shown in FIG. 11.

In each of the processing units PU<5>, . . . , and PU<0> of the sixth to first bits, the value "1" is set as a temporary value to the bit value of a corresponding one of the sixth to first bits.

As a result, the output control circuit 950 outputs a bit string including the digital value ADCOUT of "10111111".

<Time t3*b*>

FIG. 16 is a schematic view for explaining the operation state of the determination processing circuit 900 in bit string determination processing in the semiconductor integrated circuit 22 according to this embodiment.

After the temporary value to the digital value is set, it is determined, based on bit determination by the comparison processing of the comparator 223_*j*, that the value of the seventh bit is "0". The determination result DR<6> of "0" is supplied to the determination result storage circuit 930<6>. The determination result storage circuit 930<6> thus stores the value "0".

The FSM 920 changes the signal level of the determination end notification signal ACK2<6> concerning the seventh bit from "L" level to "H" level in accordance with the signals Qp and Qn from the comparator 223_*j* and the signal RY (signal CKa) from the NOR gate 224_*j*.

The selector 951<6> selects the signal from the determination result storage circuit 930<6> based on the determination end notification signal ACK2<6> of "H" level. The selector 951<6> outputs the signal of "L" level from the determination result storage circuit 930<6>.

As a result, if the determination result of the bit value of the seventh bit is "0", the bit value of the seventh bit is set to "0" that is the same value as the temporary value.

The AND gate 953<6> outputs a signal of "L" level based on the result of an AND operation of the determination end notification signal ACK2<6> of "H" level and the signal of "L" level.

The selector 954<6> supplies the signal of "L" level from the AND gate 953<6> to the NOR gate 959<5> of the processing unit PU<5> of the subsequent stage based on the metastable notification signal ACK1<6> of "H" level.

In the processing unit PU<5>, the NOR gate 959<5> outputs a signal of "H" level based on the result of a NOR operation of the signal of "L" level and the metastable notification signal ACK1<5> of "L" level.

The selector 951<5> selects the signal from the NOR gate 959<5> based on the determination end notification signal ACK2<5> of "L" level. The selector 951<5> outputs the signal of "H" level from the NOR gate 959<5>.

As a result, the temporary value of "1" is set to the value of the sixth bit of the bit string.

The selector 954<5> selects the signal from the NOR gate 959<5> based on the metastable notification signal ACK1<5> of "L" level. The selector 954<5> outputs a signal of "L" level that is the inverted signal of the signal from the NOR gate 959<5> to the NOR gate 959<4> of the subsequent stage.

In each of the processing units PU<4>, . . . , and PU<0> corresponding to the fifth to first bits, the temporary value of "1" is set a corresponding one of the bit values by substantially the same operation as the processing unit PU<5>.

<Time t4*b*>

After the bit value of the seventh bit is determined, determination processing of the bit value of the sixth bit is executed. For example, at time t4*b*, without the occurrence of the metastable state, it is determined that the bit value of the sixth bit is "0".

Figure 17:
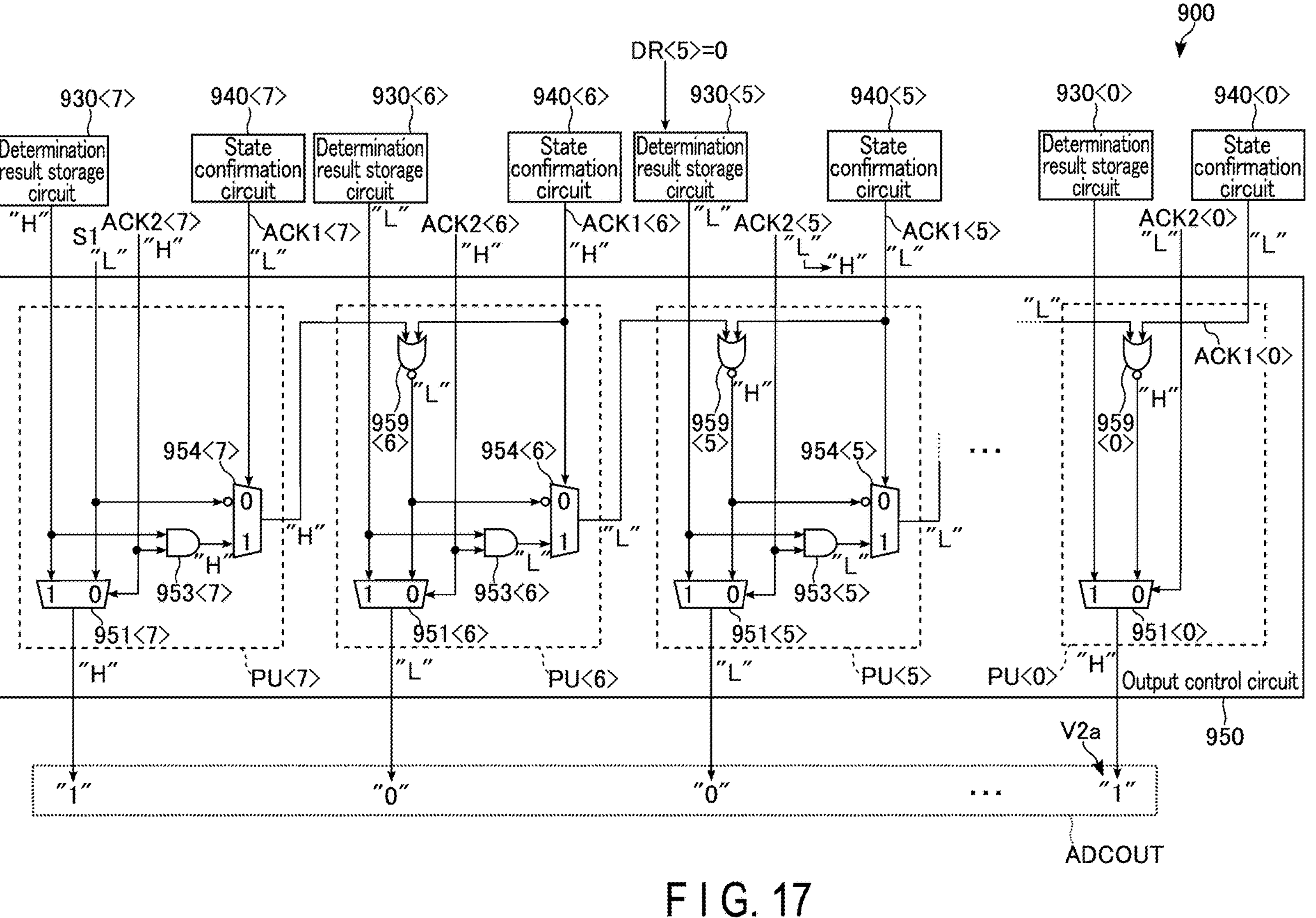
FIG. 17 is a schematic view showing still another state of the operation of the semiconductor integrated circuit according to the first embodiment.

FIG. 17 is a schematic view for explaining the operation state of the determination processing circuit 900 in bit string determination processing in the semiconductor integrated circuit 22 according to this embodiment. As shown in FIG. 17, the determination result storage circuit 930<5> stores the determination result DR<5> of "0".

The FSM 920 changes the signal level of the determination end notification signal ACK2<5> concerning the sixth bit from "L" level to "H" level based on the signals Qp and Qn and the signal RY (signal CKa).

The selector 951<5> selects the signal from the determination result storage circuit 930<5> based on the determination end notification signal ACK2<5> of "H" level. The selector 951<5> outputs a signal of "L" level.

The AND gate 953<5> outputs a signal of "L" level by an AND operation of the determination end notification signal ACK2<5> of "H" level and the signal of "L" level from the determination result storage circuit 930<5>.

The NOR gate 959<5> outputs a signal of "H" level by a NOR operation of the signal of "L" level from the processing unit PU<6> of the preceding stage and the metastable notification signal ACK1<5> of "L" level.

The selector 954<5> selects the signal from the NOR gate 959<5> based on the metastable notification signal ACK1<5> of "L" level. The selector 954<5> outputs a signal of "L" level that is the inverted signal of the signal from the NOR gate 959<5> to the NOR gate 959 of the processing unit PU<4> of the subsequent stage.

In each of the processing units PU<4>, . . . , and PU<0> of the subsequent stage, the selector 951 outputs a signal from the NOR gate 959, like the above-described example.

At time t4*b*, the output control circuit 950 thus outputs the digital value ADCOUT of "10011111". Of the 8-bit digital value, "11111" that are the values of the fifth to first bits are temporary values.

After that, each of the processing units PU<4>, . . . , and PU<0> outputs a temporary value or the value of a determination result depending on whether the metastable state occurs during the determination of the corresponding bit, substantially like the above-described operation. As a result, the value of each bit is sequentially set during the period of the SAR operation.

As described above, even if the determination result of the bit for which the metastable state occurs has the same value (here, "0") as the set temporary value, a value according to the operation of the processing unit PU is set for each corresponding bit in accordance with the presence/absence of the occurrence of the metastable state, Note that if the bit value of the eighth bit is determined to be "0" without the occurrence of the metastable state, in the processing unit PU<7> of the eighth bit, the selector 954<7> outputs a signal of "H" level that is the inverted signal of the signal S1 based on the metastable notification signal ACK1<7> of "L" level without depending on the value of the determination result DR<7> of the eighth bit.

After that, in the processing unit PU<6> of the seventh bit, if it is determined that the state of bit determination of the seventh bit is the metastable state, the NOR gate 959<6> receives the metastable notification signal ACK1<6> of "H" level. The NOR gate 959<6> outputs a signal of "L" level by a NOR operation of the signal of "H" level and the metastable notification signal ACK1<6> of "H" level.

The selector 951<6> outputs the signal of "L" level from the NOR gate 959<6> based on the determination end notification signal ACK2<6> of "L" level. The temporary value set to the bit of the seventh bit in the metastable state is "0".

As described above, the temporary value set to the bit in the metastable state has the value "0" without depending on the determination result of the upper bit.

If bit determination of the eighth bit is in the metastable state, each processing unit PU operates as follows.

In the processing unit PU<7> of the eighth bit in the metastable state, the selector 951<7> outputs the signal S1 of "L" level as the temporary value of the bit value of the eighth bit based on the determination end notification signal ACK2<7> of "L" level. The AND gate 953<7> outputs a signal of "L" level based on the result of an AND operation of the initial value ("0") of the determination result storage circuit 930<7> and the determination end notification signal ACK2<7> of "L" level.

The selector 954<7> selects the signal of "L" level from the AND gate 953<7> based on the metastable notification signal ACK1<7> of "H" level. The signal of "L" level is supplied from the selector 954<7> to the NOR gate 959<6> of the processing unit PU<6> of the subsequent stage.

In the processing unit PU<6> of the seventh bit, the NOR gate 959<6> outputs a signal of "H" level based on a NOR operation of the signal of "L" level from the selector 954<7> and the metastable notification signal ACK1<6> of "L" level.

The selector 951<6> outputs the signal of "H" level for the NOR gate 959<6> based on the determination end notification signal ACK2<6> of "L" level.

The selector 954<6> outputs a signal of "L" level that is the inverted signal of the signal from the NOR gate 959<6> based on the metastable notification signal ACK1<6> of "L" level.

In each of the processing units PU<5>, . . . , and PU<0> of the sixth to first bits, the selector 951 outputs a signal of "H" level from the NOR gate 959 by substantially the same operation as the operation of the processing unit PU<6> of the seventh bit.

As a result, in a period until the determination of the bit value of the eighth bit is ended, the output control circuit 950 outputs a digital value of "01111111" that is a temporary value. After that, the value of each bit is sequentially set during the period of the SAR operation.

As described above, the determination processing circuit 900 of the semiconductor integrated circuit 22 according to this embodiment executes determination processing of a bit string in the SAR operation.

(c) Summary

A general SAR-ADC performs bit determination by comparison processing of a comparator for two differential input signals. If the differential input signals to the comparator are small, time for bit determination by comparison processing of the comparator exponentially increases.

If the SAR-ADC is an asynchronous operation type SAR-ADC, processing does not transition to the determination of the next bit unless determination of a certain bit in the bit string is ended. For this reason, if the determination of all bits in the bit string is not ended, the value of a lower bit is maintained in the initial value.

If a long period occurs for determination of a certain bit during determination processing of the bit string, the semiconductor integrated circuit 22 according to this embodiment sets temporary values for the bit and bits lower than that bit.

For example, if two rising edges occur in the signal CK2_SUM_y serving as the reference for measuring the determination period of a certain bit in the bit string (if the period Tz of one cycle of the signal CK2_SUM_y has elapsed), the semiconductor integrated circuit 22 according to this embodiment determines that the bit determination under execution is in the metastable state. In this way, the semiconductor integrated circuit 22 according to this embodiment detects which bit has taken a long period for the determination.

The semiconductor integrated circuit 22 according to this embodiment sets a temporary value having a first value for a bit corresponding to bit determination determined to be in the metastable state. Furthermore, the semiconductor integrated circuit according to this embodiment sets a temporary value of a second value different from the first value for one or more bits lower than the bit of the temporary value of the first value.

In a state in which the temporary values are set for the bit string, the semiconductor integrated circuit 22 according to this embodiment continues the determination processing for the bit determined to be in the metastable state. The semiconductor integrated circuit 22 according to this embodiment sets a value according to the determination result of the bit value for the bit of the set temporary value again.

As described above, even if a long determination period occurs for a specified bit, the semiconductor integrated circuit 22 according to this embodiment can set a more suitable temporary value for each bit lower than the bit in accordance with the value of the bit.

As described above, the semiconductor integrated circuit 22 according to this embodiment designates an assumed temporary value for one or more bits at the starting point from a bit whose bit determination takes long time.

Hence, even if the determination of all bits is not ended during a particular period of the SAR operation, the semiconductor integrated circuit 22 according to this embodiment can acquire a bit string including a digital value close to an original analog value supplied to the SAR-ADC.

As a result, the semiconductor integrated circuit and the reception device according to this embodiment can generate a more suitable digital signal based on an analog signal.

(2) Second Embodiment

A semiconductor integrated circuit according to a second embodiment will be described with reference to FIGS. 18 and 19.

In accordance with the time of a rising edge of a clock, even if a period corresponding to one cycle or more of a signal CK2_SUM_y elapses during determination of a certain bit, it may be confirmed that the state of bit determination is not a metastable state.

In a semiconductor integrated circuit 22 according to this embodiment, a determination processing circuit 900 of a control logic circuit 225_*j* confirms whether the state of bit determination is the metastable state using a falling edge of the signal CK2_SUM_y in addition to a rising edge of the signal CK2_SUM_y.

FIG. 18 is a block diagram showing an internal configuration of a state confirmation circuit 940Z of the determination processing circuit 900 in the semiconductor integrated circuit 22 according to this embodiment.

As shown in FIG. 18, a state confirmation circuit 940Z<m−1> includes two circuit blocks BK1 and BK2, an OR gate 948, and a delay element 949.

The circuit block BK1 has substantially the same configuration as the internal configuration of the state confirmation circuit 940<m−1> shown in FIG. 6. The circuit block BK1 includes a NAND gate 941*a*, a delay element 942*a*, a plurality of flip-flops 943*a*, 944*a*, and 945*a*, an AND gate 946*a*, and an OR gate 947*a*. These components are substantially the same as those components shown in FIG. 6.

The input node of the flip-flop 943*a* receives a signal indicating the operation state of bit determination from the FSM 920. The output node of the flip-flop 943*a* is connected to the input node of the flip-flop 944*a* and the first input node of the AND gate 946*a*. The output node of the flip-flop 944*a* is connected to the second input node of the AND gate 946*a*. The output node of the AND gate 946*a* is connected to the first input node of the OR gate 947*a*. The second input node of the OR gate 947*a* is connected to the output node of the flip-flop 945*a*. The input node of the flip-flop 945*a* is connected to the output node of the OR gate 947*a*.

The circuit block BK2 includes a plurality of flip-flops 943*b*, 944*b*, and 945*b*, an AND gate 946*b*, and an OR gate 947*b*. These components are substantially the same as those components of the circuit block BK1.

The input node of the flip-flop 943*b* receives the signal indicating the operation state of bit determination of the FSM 920. The output node of the flip-flop 943*b* is connected to the input node of the flip-flop 944*b* and the first input node of the AND gate 946*b*. The output node of the flip-flop 944*b* is connected to the second input node of the AND gate 946*b*. The output node of the AND gate 946*b* is connected to the first input node of the OR gate 947*b*. The second input node of the OR gate 947*b* is connected to the output node of the flip-flop 945*b*. The input node of the flip-flop 945*b* is connected to the output node of the OR gate 947*b*.

A first input node of the OR gate 948 is connected to the output node of the OR gate 947*a*. A second input node of the OR gate 948 is connected to the output node of the OR gate 947*b*. An output node of the OR gate 948 outputs the result of an OR operation of a signal from the circuit block BK1 and a signal from the circuit block BK2. The signal output from the OR gate 948 is a metastable notification signal ACK1<m−1>.

An output node of the delay element 949 is connected to the clock nodes of the flip-flops 943*b*, 944*b*, and 945*b* in the circuit block BK2. An input node of the delay element 949 receives the signal CK2_SUM_y. The delay element 949 delays the cycle of the signal CK2_SUM_y by a ½ cycle.

Each of the plurality of flip-flops 943*a*, 944*a*, and 945*a* in the circuit block BK1 receives the signal CK2_SUM_y by the clock node. Each of the flip-flops 943*a*, 944*a*, and 945*a* operates in synchronism with the rising edge of the signal CK2_SUM_y.

Each of the plurality of flip-flops 943*b*, 944*b*, and 945*b* in the circuit block BK2 receives the signal CK2_SUM_y by the clock node via the delay element 949. Each of the flip-flops 943*b*, 944*b*, and 945*b* operates in synchronism with the rising edge of a delay signal of the signal CK2_SUM_y. For example, the flip-flops 943*b*, 944*b*, and 945*b* latch the supplied signal at a timing delayed by a ½ cycle from the flip-flops 943*a*, 944*a*, and 945*a*. That is, each of the flip-flops 943*b*, 944*b*, and 945*b* operates at a timing according to the falling edge of the signal CK2_SUM_y.

The reset node of each of the plurality of flip-flops 943*b*, 944*b*, and 945*b* is connected to the output node of the NAND gate 941*a*. The plurality of flip-flops 943*b*, 944*b*, and 945*b* are set in a reset state at a timing simultaneous to the reset of plurality of flip-flops 943*a*, 944*a*, and 945*a* in accordance with a signal from the NAND gate 941*a*.

In the state confirmation circuit 940Z<m−1> shown in FIG. 18, as in the above-described embodiment, if two rising edges of the signal CK2_SUM_y are detected during the period of determination of a certain bit, the state confirmation circuit 940Z<m−1> outputs the metastable notification signal ACK1 of "H" level by the operations of the circuit block BK1 and the circuit block BK2.

Figure 19:
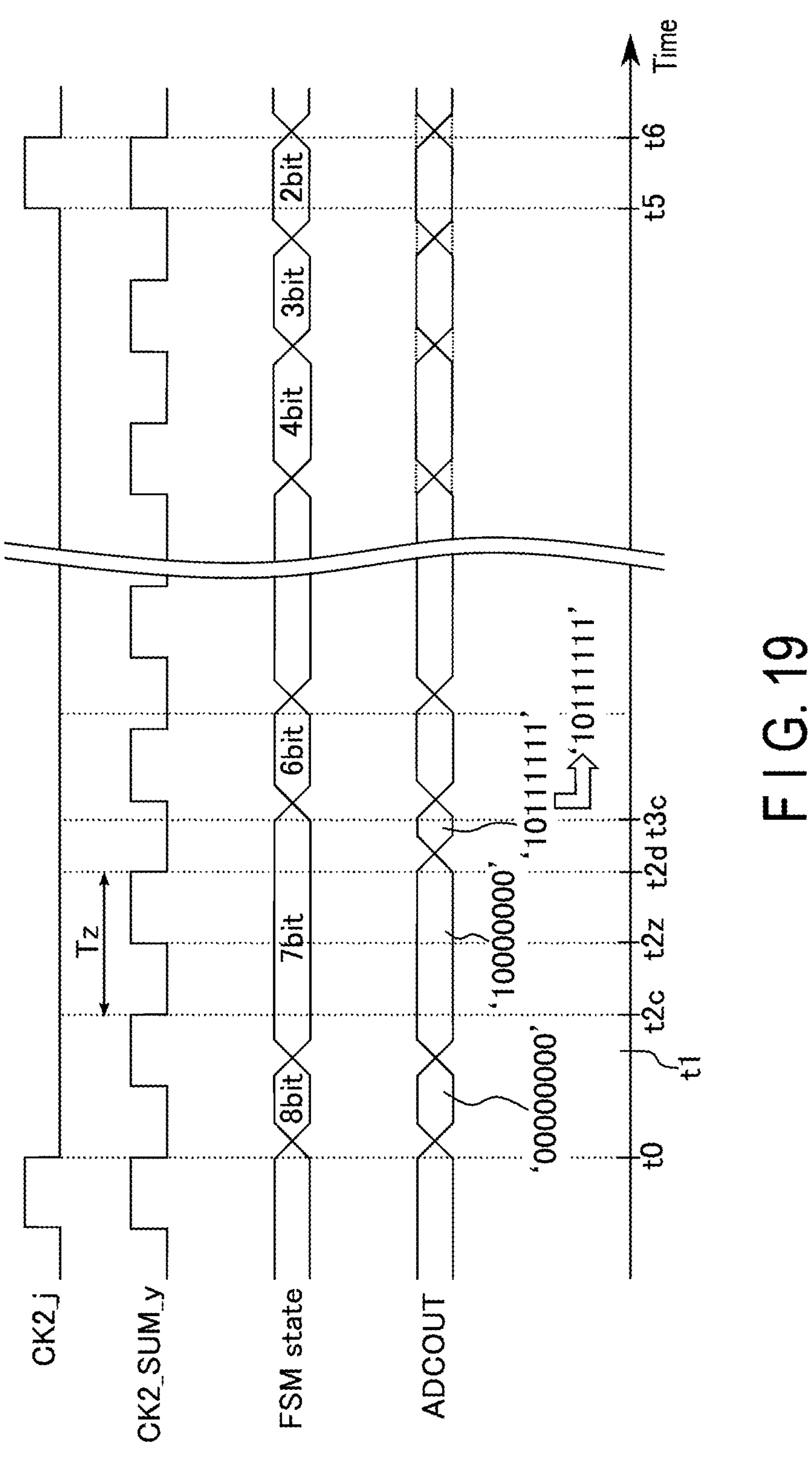
FIG. 19 is a timing chart for explaining an example of an operation of the semiconductor integrated circuit according to the second embodiment.

FIG. 19 is a timing chart for explaining an example of an operation of the determination processing circuit 900 in the semiconductor integrated circuit 22 according to second embodiment.

As shown in FIG. 19, at time t2*z* during the period of determination processing of the seventh bit, a first rising edge of the signal CK2_SUM_y occurs. During the determination period of the seventh bit, two falling edges of the signal CK2_SUM_y occur at time t2*c* and time t2*d*. A period Tz from time t2*c* to time t2*d* corresponds to the period of one cycle of the signal CK2_SUM_y.

In the state confirmation circuit 940Z<m−1>, the circuit block BK2 latches the signal from the FSM 920 at the timing of each of the two falling edges of the signal CK2_SUM_y.

If two falling edges are detected during the period of determination of a certain bit, the state confirmation circuit 940Z<m−1> outputs the metastable notification signal ACK1 of "H" level by the operation of the circuit block BK2.

Hence, if two rising edges of the signal CK2_SUM_y are detected, or two falling edges of the signal CK2_SUM_y are detected during the period of determination of a certain bit, the state confirmation circuit 940Z<m−1> supplies the metastable notification signal ACK1 of "H" level to the output control circuit 950.

As described above, even if bit determination is not ended after the elapse of the period Tz of one cycle of the signal CK2_SUM_y, the determination processing circuit 900 can confirm the possibility of the metastable state in bit determination by the both the rising edge and the falling edge of the clock.

In the semiconductor integrated circuit 22 according to this embodiment, the determination processing circuit 900 can detect, in a relatively short period, that bit determination is in the metastable state.

Hence, the semiconductor integrated circuit and the reception device according to this embodiment can obtain a more suitable digital signal from an analog signal.

(3) Application Example

An application example of the semiconductor integrated circuit according to the embodiment will be described with reference to FIG. 20.

As shown in FIG. 20, the semiconductor integrated circuit 22 and the reception device 4 (4*a* or 4*b*) according to the embodiment are applied to an information communication system 1000.

As shown in FIG. 20, the information communication system 1000 includes a host device 1100 and a memory system 1200. The memory system 1200 performs data write, data read, and data erase in the memory system 1200 based on a request from the host device 1100. The internal configuration of the memory system 1200 will be described later.

The host device 1100 includes a processor 1101, a RAM 1102, and an interface circuit 1103.

The processor (to be also referred to as a host processor hereinafter) 1101 controls various kinds of processing and operations of the host device 1100. The host processor 1101 can issue a command (to be referred to as a host command hereinafter) for requesting (instructing) various kinds of processing and operations to the memory system 1200. The host processor 1101 can generate data according to the host command. The generated data is information used for processing and operations of the memory system 1200. The generated data is, for example, an address, a parameter, or data to be written to the memory system 1200.

The RAM 1102 has a function as a work area for various kinds of data processing by the host processor 1101. The RAM 1102 temporarily stores programs and data to be used for various kinds of processing by the host processor 1101.

The interface circuit (to be also referred to as a host interface (host I/F)) 1103 performs communication with the memory system 1200 based on a certain interface standard and/or a communication protocol. The interface circuit 1103 includes, in a physical layer (PHY layer), a transmission device 2*a* for transmission of data and a reception device 4*a* for reception of data. The reception device 4*a* includes the semiconductor integrated circuit 22 according to the embodiments.

Note that the host command to the memory system 1200 is based on the interface standard of the interface circuit 1103. For example, the interface standard (or the communication protocol) used in the interface circuit 1103 is selected from the SAS standard, the SATA standard, the PCIexpress™ standard (to be referred to as the PCIe™ standard hereinafter), the NVMexpress™ standard (to be referred to as the NVMe™ standard hereinafter), and the M-PHY standard applied to a UFS (Universal Flash Storage) device. Note that an interface standard complying with one of these standards or another interface standard may be used in the interface circuit 1103.

In addition to the above-described components, the host device 1100 may further includes a storage device (not shown) such as an HDD (Hard Disc Drive).

For example, the host device 1100 or the information communication system 1000 is a personal computer, a smartphone, a feature phone, a portable terminal (for example, a tablet terminal), a game device, an in-vehicle terminal, a router, or a base station.

The memory system 1200 includes a memory controller 1210, and a NAND flash memory (to be referred to as a flash memory hereinafter) 1220.

The memory controller 1210 instructs (commands) the flash memory system 1220 to do various kinds of processing and operations such as data write, data read, and data erase based on a request from the host device 1100.

The memory controller 1210 includes a processor 1211, a RAM 1212, a buffer circuit 1213, and interface circuits 1214 and 1215.

The processor 1211 can instruct the flash memory 1220 to do various kinds of processing or operations. For example, the processor 1211 can generate a command (to be also referred to as a controller command hereinafter) indicating an instruction to the flash memory 1220.

The RAM 1212 functions as a work area for various kinds of processing and operations of the processor 1211 in the memory controller 1210. The RAM 1212 temporarily stores programs and data (results of calculation processing, data halfway through the calculation processing, and parameters) to be used for various kinds of processing by the processor 1211. Note that the RAM 1212 may be a memory area provided in the processor 1211.

The buffer circuit 1213 temporarily stores data transferred between the memory controller 1210 and the host device 1100 and data transferred between the memory controller 1210 and the flash memory 1220.

The interface circuit (to be also referred to as a host interface (host I/F) circuit) 1214 performs data transfer between the host device 1100 and the memory controller 1210 based on a certain interface standard. The interface standard and the communication protocol of the interface circuit 1214 are the same standard as the interface standard of the interface circuit 1103 of the host device 1100 (or a standard complying with the interface standard). For example, the interface circuit 1214 performs communication of serial transmission with the interface circuit 1103.

The interface circuit (to be also referred to as a memory interface (memory I/F) circuit) 1215 performs communication (for example, data transfer) between the memory controller 1210 and the flash memory 1220 based on the NAND interface standard. The interface circuit 1215 performs, for example, communication of parallel transmission with the flash memory 1220. The interface circuit 1215 includes a transmission device and a reception device in a physical layer (PHY layer).

If the memory controller 1210 instructs the flash memory 1220 to perform a certain operation, the memory controller 1210 sends a data group (to be also referred to as a memory command set hereinafter) including a command and an address to the flash memory 1220. Note that if the memory controller 1210 instructs the flash memory 1220 to perform data write, the memory command set further includes write data.

Note that in addition to the above-described components, the memory controller 1210 may further includes another component such as an ECC circuit (not shown) configured to detect and correct an error in data.

The flash memory 1220 is a non-volatile semiconductor memory device. The flash memory 1220 can substantially nonvolatilely store data. The flash memory 1220 write data sent from the memory controller 1210 in a memory cell array (not shown). The flash memory 1220 reads data requested by the memory controller 1210 from the memory cell array.

The flash memory 1220 communicates with the memory controller 1210. The communication between the flash memory 1220 and the memory controller 1210 is supported by the NAND interface standard.

For example, the memory system 1200 is an SSD (Solid State Drive), a UFS (Universal Flash Storage) device, a memory card, or a USB (Universal Serial Bus) memory. Note that in place of the flash memory 1220, another non-volatile or volatile memory device may be used for the memory system 1200.

For example, in the memory system 1200, the interface circuit 1214 of the memory controller 1210 includes a transmission device 2*b* and a reception device 4*b* in a physical layer (PHY layer). The reception device 4*b* includes the semiconductor integrated circuit 22 according to the embodiment.

Concerning the communication (signal transmission) between the host device 1100 and the memory system 1200, the transmission device 2*b* of the interface circuit 1214 sends various kinds of signals (for example, data) to the reception device 4*a* of the interface circuit 1103. Concerning the communication between the host device 1100 and the memory system 1200, the reception device 4*b* of the interface circuit 1214 receives various kinds of signals from the transmission device 2*a* of the interface circuit 1103. For example, in the memory system 1200, the memory controller 1210 can perform various kinds of processing for data from the reception device 4*b*.

For example, the transmission device 2*b* and the reception device 4*b* are used for data transfer at a relatively high speed of 10 Gbps or more (for example, data transfer of 100-Gbps class).

Note that the semiconductor integrated circuit 22 according to the embodiment and the reception device 4 according to the embodiment may be used for the interface circuit 1215.

As described above, the semiconductor integrated circuit 22 according to the embodiment and the reception device 4 according to the embodiment are applied to the host device 1100 and the memory system 1200.

(4) Other Embodiment

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:

a comparator configured to execute comparison processing of differential analog signals; and a control circuit configured to determine values of a plurality of bits based on a result of the comparison processing of the comparator and generate a digital signal including the determined values of the plurality of bits, wherein the control circuit is configured to:

set an initial value for a first bit of a determination target among the plurality of bits, and if the determination of the first bit is not ended in a first period, set a first temporary value having a first value for the first bit.

2. The circuit according to claim 1, wherein in accordance with setting of the first temporary value, the control circuit is further configured to set a second temporary value having a second value different from the first value for a second bit lower than the first bit among the plurality of bits.

3. The circuit according to claim 1, wherein the control circuit includes a first circuit configured to store a first determination value of the first bit determined based on the result of the comparison processing, and the control circuit is further configured to set the first determination value for the first bit if the determination of the first bit is ended.

4. The circuit according to claim 1, wherein the control circuit includes:

a second circuit configured to generate a periodical signal including an edge having periodicity; and a third circuit configured to confirm an operation state of the determination of the first bit based on the periodical signal.

5. The circuit according to claim 4, wherein the first period is a period from a first rising edge to a second rising edge of the periodical signal, or a period from a first falling edge to a second falling edge of the periodical signal.

6. The circuit according to claim 1, wherein the control circuit includes a first processing circuit configured to output a value of the first bit, and the first processing circuit is configured to:

receive a first state notification signal indicating whether the determination of the first bit is in a stagnant state, and a first end notification signal indicating whether the determination of the first bit is ended, if the first end notification signal indicates that the determination of the first bit is not ended, output the first temporary value as the value of the first bit, and if the first end notification signal indicates that the determination of the first bit is ended, output a first determination value of the first bit as the value of the first bit.

7. The circuit according to claim 6, wherein the first processing circuit includes:

a first selector configured to select one of an internal signal and a first storage value in a first storage circuit corresponding to the first bit based on the first end notification signal;

a first AND gate configured to output a first AND operation value of the first end notification signal and the first storage value; and a second selector configured to select one of a negative logic value of the internal signal and the first AND operation value based on the first state notification signal.

8. The circuit according to claim 6, wherein the control circuit includes a second processing circuit configured to output a value of a second bit lower than the first bit, and the second processing circuit is configured to:

receive a second state notification signal indicating whether the determination of the second bit is in the stagnant state, and a second end notification signal indicating whether the determination of the second bit is ended, if the first state notification signal indicates that the determination of the first bit is in the stagnant state, and the second end notification signal indicates that the determination of the second bit is not ended, receive a second signal from the first processing circuit and output a second temporary value based on a result of a logical operation of a value of the second signal and a value of the second state notification signal as the value of the second bit, and if the second end notification signal indicates that the determination of the second bit is ended, output a second determination value of the second bit as the value of the second bit.

9. The circuit according to claim 8, wherein the first processing circuit includes:

a first selector configured to select one of an internal signal and a first storage value in a first storage circuit corresponding to the first bit based on the first end notification signal;

a first AND gate configured to output a first AND operation value of the first end notification signal and the first storage value; and a second selector configured to select one of a negative logic value of the internal signal and the first AND operation value based on the first state notification signal, and the second processing circuit includes:

a NOR gate configured to output a NOR operation value of an output signal from the second selector and the second state notification signal;

a third selector configured to select one of the NOR operation value and a second storage value in a second storage circuit corresponding to the second bit based on the second end notification signal;

a second AND gate configured to output a second AND operation value of the second end notification signal and the second storage value; and a fourth selector configured to select one of a negative logic value of the NOR operation value and the second AND operation value based on the second state notification signal.

10. The circuit according to claim 6, wherein the control circuit includes a second processing circuit configured to output a value of a second bit lower than the first bit, and the first processing circuit is configured to:

output a first signal according to the first temporary value to the second processing circuit if the first state notification signal indicates that the determination of the first bit is not in the stagnant state, and output a second signal to the second processing circuit if the first state notification signal indicates that the determination of the first bit is in the stagnant state.

11. The circuit according to claim 10, wherein the second signal includes a third value based on a logical operation of a value of the first end notification signal and the value of the first bit.

12. A reception device comprising:

the semiconductor integrated circuit of claim 1;

an analog circuit configured to receive differential signals and output the differential analog signals based on the received differential signals to the semiconductor integrated circuit; and a digital circuit configured to process the digital signal generated by the semiconductor integrated circuit.

13. The device according to claim 12, wherein in accordance with setting of the first temporary value, the control circuit of the semiconductor integrated circuit is further configured to set a second temporary value having a second value different from the first value for a second bit lower than the first bit among the plurality of bits.

14. The device according to claim 12, wherein the control circuit of the semiconductor integrated circuit includes a first circuit configured to store a first determination value of the first bit determined based on the result of the comparison processing, and the control circuit of the semiconductor integrated circuit is further configured to set the first determination value for the first bit if the determination of the first bit is ended.

15. The device according to claim 12, wherein the control circuit of the semiconductor integrated circuit includes:

a second circuit configured to generate a periodical signal including an edge having periodicity; and a third circuit configured to confirm an operation state of the determination of the first bit based on the periodical signal.

16. The device according to claim 15, wherein the first period is a period from a first rising edge to a second rising edge of the periodical signal, or a period from a first falling edge to a second falling edge of the periodical signal.

17. The device according to claim 12, wherein the control circuit of the semiconductor integrated circuit includes a first processing circuit configured to output a value of the first bit, and the first processing circuit is configured to:

receive a first state notification signal indicating whether the determination of the first bit is in a stagnant state, and a first end notification signal indicating whether the determination of the first bit is ended, if the first end notification signal indicates that the determination of the first bit is not ended, output the first temporary value as the value of the first bit, and if the first end notification signal indicates that the determination of the first bit is ended, outputs a first determination value of the first bit as the value of the first bit.

18. A memory system comprising:

a controller including a reception device including the semiconductor integrated circuit of claim 1, and a memory device connected to the controller.

19. The system according to claim 18, wherein in accordance with setting of the first temporary value, the control circuit of the semiconductor integrated circuit is further configured to set a second temporary value having a second value different from the first value for a second bit lower than the first bit among the plurality of bits.

20. The system according to claim 18, wherein the control circuit of the semiconductor integrated circuit includes a first circuit configured to store a first determination value of the first bit determined based on the result of the comparison processing, and the control circuit is further configured to set the first determination value for the first bit if the determination of the first bit is ended.

* * * * *